United States Patent
Sato et al.

(10) Patent No.: US 7,303,856 B2
(45) Date of Patent: Dec. 4, 2007

(54) LIGHT-SENSITIVE SHEET COMPRISING SUPPORT, FIRST LIGHT-SENSITIVE LAYER AND SECOND LIGHT-SENSITIVE LAYER

(75) Inventors: Morimasa Sato, Shizuoka (JP); Yuichi Wakata, Shizuoka (JP); Masanobu Takashima, Shizuoka (JP); Tomoko Tashiro, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 456 days.

(21) Appl. No.: 10/871,020

(22) Filed: Jun. 21, 2004

(65) Prior Publication Data
US 2005/0025946 A1 Feb. 3, 2005

(30) Foreign Application Priority Data

| Jun. 20, 2003 | (JP) | ............................ 2003-177178 |
| Dec. 26, 2003 | (JP) | ............................ 2003-433828 |
| Jan. 26, 2004 | (JP) | ............................ 2004-017593 |

(51) Int. Cl.
*G03F 7/027* (2006.01)
*G03F 7/028* (2006.01)
*G03F 7/032* (2006.01)
*G03F 7/095* (2006.01)

(52) U.S. Cl. .................... 430/273.1; 430/312; 430/325
(58) Field of Classification Search ............. 430/273.1, 430/312, 325
See application file for complete search history.

(56) References Cited

U.S. PATENT DOCUMENTS

| 4,835,086 | A * | 5/1989 | Jain ............................ 430/312 |
| 6,162,589 | A * | 12/2000 | Chen et al. .................. 430/320 |
| 6,635,581 | B2 * | 10/2003 | Wong .......................... 438/736 |
| 6,727,046 | B1 * | 4/2004 | Bryan-Brown et al. ..... 430/321 |
| 6,797,456 | B1 * | 9/2004 | Gu et al. ..................... 430/312 |
| 2001/0053486 | A1 * | 12/2001 | Matsunuma ..................... 430/5 |
| 2003/0129547 | A1 * | 7/2003 | Neisser et al. .............. 430/322 |
| 2003/0162107 | A1 * | 8/2003 | Sato ............................... 430/7 |
| 2003/0224255 | A1 * | 12/2003 | Fujimori ........................ 430/7 |

FOREIGN PATENT DOCUMENTS

| JP | 4-301846 | * 10/1992 |
| JP | 10-111573 | * 4/1998 |

* cited by examiner

*Primary Examiner*—Richard L. Schilling
(74) *Attorney, Agent, or Firm*—Sughrue Mion Pllc.

(57) ABSTRACT

A light-sensitive sheet comprises a support, a first light-sensitive layer and a second light-sensitive layer in this order. Each of the first and second light sensitive layers independently contains a binder, a polymerizable compound and a photo-polymerization initiator. The second light-sensitive layer is more sensitive to light than the first light-sensitive layer. A light-sensitive laminate comprises a substrate, the second light-sensitive layer and the first light-sensitive layer in this order.

13 Claims, 4 Drawing Sheets

LIGHT-SENSITIVE SHEET COMPRISING SUPPORT, FIRST LIGHT-SENSITIVE LAYER AND SECOND LIGHT-SENSITIVE LAYER

FIELD OF THE INVENTION

The present invention relates to a light-sensitive sheet comprising a support, a first light-sensitive layer and a second light-sensitive layer in this order. Each of the first and second light sensitive layers independently contains a binder, a polymerizable compound and a photo-polymerization initiator. The invention also relates a light-sensitive laminate comprising a substrate, a second light-sensitive layer and a first light-sensitive layer in this order. The invention particularly relates to a light-sensitive sheet or a light-sensitive laminate that can be advantageously used for preparation of a printed circuit board. The invention further relates to a process for forming an image pattern or a circuit pattern using the light-sensitive laminate. The invention furthermore relates to a process for forming a circuit pattern on a printed circuit board by using the light-sensitive sheet or the light-sensitive laminate.

BACKGROUND OF THE INVENTION

A light-sensitive sheet comprising a support and a light-sensitive layer is widely used as a material for forming an image pattern. In more detail, the light-sensitive sheets are used to prepare printed circuit boards, display elements (e.g., color filter, column, rib, spacer, partition) or other imaging products (e.g., printing plate, hologram, micromachine, proof).

A printed circuit board is prepared by forming a circuit pattern with a photo-litho process. The photo-litho process uses the light-sensitive sheet comprising a transparent support (e.g., polyethylene terephthalate film) and a light-sensitive layer. The light-sensitive (transferring) sheet is sometimes referred to as a dry film-resist in the field of photo-litho process.

A printed circuit board having through-holes can be prepared, for example by the steps of:

(1) making a through-hole on a substrate (e.g., copper-clad laminate) of printed circuit board;

(2) forming a metal plating layer on an inner wall of the through-holes;

(3) laminating the light-sensitive layer of a light-sensitive sheet on a surface of the substrate;

(4) exposing the light-sensitive laminate to light corresponding to a pattern comprising an area where a circuit pattern is formed and an area of the through-holes, to harden the light-sensitive layer within the areas;

(5) peeling the transparent support from the light-sensitive sheet;

(6) dissolving the unhardened area in a developing solution to remove the unhardened area of the light-sensitive layer while keeping the hardened areas where the circuit pattern is formed and where the through-hole is located (the hardened layer remaining in the area where the through-hole is located is often referred to as "tenting film");

(7) subjecting the bared metal plating layer of the substrate to an etching treatment; and (8) removing the light-sensitive layer within the hardened areas to form the circuit pattern on the substrate.

A metal plating layer in a through-hole can be protected according to a method using a tenting film formed at step (6). The method is generally referred to as a tenting method.

A multi-layered printed circuit board often has a via-hole in place of (or in addition to) the through-hole. The via-hole connects the layers in the circuit. A metal plating layer in the via-hole should be also protected with the tenting film to form a circuit pattern.

A recent printed circuit board is required to be more densely integrated. Accordingly, a light-sensitive sheet is required to give a circuit pattern with high resolution. A thin light-sensitive layer is effective in improving resolution of the light-sensitive sheet. On the other hand, a tenting film formed by hardening the light-sensitive layer has a function of protecting the through-hole or the via-hole in the printed circuit board, as is described above. A thin tenting film formed from the thin light-sensitive layer is liable to break while dissolving the unhardened area of the light-sensitive layer in a developing solution to remove the unhardened area, or while subjecting the bared metal plating layer to an etching treatment.

Therefore, the light-sensitive sheet has been improved to form a strong tenting film as well as a pattern with high resolution.

Japanese Patent Provisional Publication No. 10(1998)-142789 discloses a light-sensitive sheet improved in components of the light-sensitive layer. The light-sensitive layer comprises a binder having carboxyl group, monomers comprising a specific vinylurethane compound and a specific acrylate compound, and a photo-polymerization initiator.

Japanese Patent Provisional Publication No. 8(1996)-54732 discloses a light-sensitive sheet improved in a layered structure. The light-sensitive sheet comprises a support, a first light-sensitive layer and a second light-sensitive layer in this order. The first light-sensitive layer is soluble in an alkaline solution, has low fluidity when heated, and is sensitive to an active energy ray. The second light-sensitive layer is soluble in an alkaline solution, and has high fluidity when heated, and is sensitive to an active energy ray. The light-sensitive sheet has through-holes. The through-holes are filled with the second light-sensitive layer to protect the metal layer in the holes.

Japanese Patent Provisional Publication No. 10(1998)-111573 discloses a light-sensitive resin laminate comprising a support, a first light-sensitive layer and a second light-sensitive layer. The two light-sensitive layers contain different vinyl copolymers, but they further contain the same specific monofunctional monomer. The light-sensitive laminate is improved in adhesion and resolution.

Japanese Patent Provisional Publication No. 3(1991)-17650 discloses a photo-resist comprising a support, a non-adhesive light-sensitive layer and an adhesive light-sensitive layer. The publication also discloses a process of preparation of a printed circuit board from the photo-resist. According to the publication, the photo-resist is improved in tenting performance and the resolution.

In the field of printing plates, Japanese Patent Publication No. 37(1962)-1306 discloses a light-sensitive plate for preparation of a printing relief. The light-sensitive plate comprises a substrate and at least two photo-polymerizable layers (thickness: 25 μm to 2.5 mm). The photo-polymerizable layers are polymerized at different rates. The photo-polymerizable layer near the substrate can be polymerized more rapidly than the other layer. The publication reports that the light-sensitive plate gives a relief image in which an area of the top face (printing face) of the relief is smaller than an area of the bottom (base) of the relief.

SUMMARY OF THE INVENTION

An object of the present invention is to provide a light-sensitive sheet and a light-sensitive laminate which can easily form a desired pattern relief having some different thicknesses.

Another object of the invention is to prepare a desired pattern relief having some different thicknesses from a light-sensitive sheet or a light-sensitive laminate according to an industrially advantageous process.

A further object of the invention is to provide a light-sensitive sheet that gives a pattern with high resolution and a tough tenting film, and is advantageously used for preparation of a printed circuit board.

A furthermore object of the invention is to prepare a printed circuit board having holes such as a through-hole and a via-hole from a light-sensitive sheet according to an industrially advantageous process.

The first embodiment of the present invention provides a light-sensitive sheet comprising a support, a first light-sensitive layer and a second light-sensitive layer in this order, wherein each of the first and second light sensitive layers independently contains a binder, a polymerizable compound and a photo-polymerization initiator, and wherein light-sensitivity of the second light-sensitive layer is higher than light-sensitivity of the first light-sensitive layer.

The first embodiment of the invention is preferably conducted as follows.

(1) A ratio of light-sensitivity of the second light-sensitive layer to light-sensitivity of the first light-sensitive layer is in the range of 2 to 200.

(2) Light energy required for completing hardening reaction of the second light-sensitive layer and light energy required for completing hardening reaction of the first light-sensitive layer satisfy the condition of:

$$0.005 < A/B < 0.5$$

in which A is the light energy required for completing hardening reaction of the second light-sensitive layer, and B is the light energy required for completing hardening reaction of the first light-sensitive layer.

(3) Light energy required for completing hardening reaction of the second light-sensitive layer and light energy required for initiating hardening reaction of the first light-sensitive layer satisfy the condition of:

$$1 < C/A < 10$$

in which A is the light energy required for completing hardening reaction of the second light-sensitive layer, and C is that for initiating hardening reaction of the first light-sensitive layer.

(4) Each of the first and second light-sensitive layers independently further contains a sensitizer, and an amount of the sensitizer contained in the second light-sensitive layer is larger than an amount of the sensitizer contained in the first light-sensitive layer.

(5) An amount of the photo-polymerization initiator contained in the second light-sensitive layer is larger than an amount of the photo-polymerization initiator contained in the first light-sensitive layer.

(6) An amount of the polymerizable compound contained in the second light-sensitive layer is larger than an amount of the polymerizable compound contained in the first light-sensitive layer.

(7) The first light-sensitive layer has a thickness in the range of 1 to 100 μm, the second light-sensitive layer has a thickness in the range of 0.1 to 15 μm, and the thickness of the first light-sensitive layer is larger than the thickness of the second light-sensitive layer.

(8) The he first light-sensitive layer has absorption of light in the range of 0.1 to 1.0 at wavelength of 405 nm.

(9) The first light-sensitive layer or the second light-sensitive layer contains a compound having the absorption maximum within wavelength region of 380 to 430 nm.

(10) The first light-sensitive layer or the second light-sensitive layer contains a sensitizer having the absorption maximum within wavelength region of 380 to 430 nm.

(11) The support comprises a transparent polymer film.

(12) The light-sensitive sheet has a shape of a long film.

(13) The light-sensitive sheet is wound up into a roll.

(14) The light-sensitive sheet comprises the support, the first light-sensitive layer, the second light-sensitive layer and a protective film in this order, and adhesion forces between the support and the first light-sensitive layer and between the protective film and the second light-sensitive layer satisfy the condition of:

$$Su > Pr$$

in which Su is the adhesion force between the support and the first light-sensitive layer, and Pr is the adhesion force between the protective film and the second light-sensitive layer.

(15) The light-sensitive sheet is used for preparation of a printed circuit board.

The second embodiment of the invention provides a light-sensitive laminate comprising a substrate, a second light-sensitive layer and a first light-sensitive layer in this order, wherein each of the first and second light sensitive layers independently contains a binder, a polymerizable compound and a photo-polymerization initiator, and light-sensitivity of the first light-sensitive layer is lower than light-sensitivity of the second light-sensitive layer.

The second embodiment of the invention is preferably conducted as follows.

(1) A ratio of light-sensitivity of the second light-sensitive layer to light-sensitivity of the first light-sensitive layer is in the range of 2 to 200.

(2) Light energy required for completing hardening reaction of the second light-sensitive layer and light energy required for completing hardening reaction of the first light-sensitive layer satisfy the condition of:

$$0.005 < A/B < 0.5$$

in which A is the light energy required for completing hardening reaction of the second light-sensitive layer, and B is the light energy required for completing hardening reaction of the first light-sensitive layer.

(3) Light energy required for completing hardening reaction of the second light-sensitive layer and light energy required for initiating hardening reaction of the first light-sensitive layer satisfy the condition of:

$$1 < C/A < 10$$

in which A is the light energy required for completing hardening reaction of the second light-sensitive layer, and C is that for initiating hardening reaction of the first light-sensitive layer.

(4) Each of the first and second light-sensitive layers independently further contains a sensitizer, and an amount of the sensitizer contained in the second light-sensitive layer is larger than an amount of the sensitizer contained in the first light-sensitive layer.

(5) An amount of the photo-polymerization initiator contained in the second light-sensitive layer is larger than an amount of the photo-polymerization initiator contained in the first light-sensitive layer.

(6) An amount of the polymerizable compound contained in the second light-sensitive layer is larger than an amount of the polymerizable compound contained in the first light-sensitive layer.

(7) The first light-sensitive layer has a thickness in the range of 1 to 100 μm, the second light-sensitive layer has a thickness in the range of 0.1 to 15 μm, and the thickness of the first light-sensitive layer is larger than the thickness of the second light-sensitive layer.

(8) The he first light-sensitive layer has absorption of light in the range of 0.1 to 1.0 at wavelength of 405 nm.

(9) The first light-sensitive layer or the second light-sensitive layer contains a compound having the absorption maximum within wavelength region of 380 to 430 nm.

(10) The first light-sensitive layer or the second light-sensitive layer contains a sensitizer having the absorption maximum within wavelength region of 380 to 430 nm.

(11) The substrate is a substrate of printed circuit.

(12) The light-sensitive laminate comprises the substrate, the second light-sensitive layer, the first light-sensitive layer and a support in this order.

The third embodiment of the invention provides a process for forming an image pattern, which comprises the steps of:

(1) exposing a light-sensitive laminate comprising a substrate, a second light-sensitive layer and a first light-sensitive layer in this order, wherein each of the first and second light sensitive layers independently contains a binder, a polymerizable compound and a photo-polymerization initiator, and wherein sensitivity of the first light-sensitive layer is lower than sensitivity of the second light-sensitive layer, to light corresponding to the image pattern from the first light-sensitive layer to harden the first and second light-sensitive layers within the area exposed to light; and then (2) developing the light-sensitive laminate whereby the unhardened areas of the first and second light-sensitive layers are removed to form the image pattern comprising an area where the hardened areas of the first and second light-sensitive layers remain on the substrate, and an area where the substrate is bared by removing the unhardened areas of the first and second light-sensitive layers.

The third embodiment of the invention is preferably conducted as follows.

(a) The light-sensitive laminate is exposed to light at the step of (1) by scanning the light-sensitive laminate with a laser beam.

(b) The light-sensitive laminate comprises the substrate, the second light-sensitive layer, the first light-sensitive layer and a support in this order, and a step of removing the transparent support from the light-sensitive laminate is conducted between the steps (1) and (2).

The fourth embodiment of the invention provides a process for forming an image pattern, which comprises the steps of:

(1) exposing a light-sensitive laminate comprising a substrate, a second light-sensitive layer and a first light-sensitive layer in this order, wherein each of the first and second light sensitive layers independently contains a binder, a polymerizable compound and a photo-polymerization initiator, to light corresponding to image patterns having at least two different light exposure energy levels from the first light-sensitive layer to harden the first and second light-sensitive layers within the area exposed to light having a higher light exposure energy level and to harden the second light-sensitive layer within the area exposed to light having a lower light exposure energy level; and then (2) developing the light-sensitive laminate whereby the unhardened areas of the first and second light-sensitive layers are removed to form the image pattern comprising an area where the hardened areas of the first and second light-sensitive layers remain on the substrate, an area where the hardened area of the second light-sensitive layers remains on the substrate, and an area where the substrate is bared by removing the unhardened areas of the first and second light-sensitive layers.

The fourth embodiment of the invention is preferably conducted as follows.

(a) The light-sensitive laminate is exposed to light at the step of (1) by scanning the light-sensitive laminate with a laser beam.

(b) The light-sensitive laminate comprises the substrate, the second light-sensitive layer, the first light-sensitive layer and a support in this order, and a step of removing the transparent support from the light-sensitive laminate is conducted between the steps (1) and (2).

(c) Light-sensitivity of the first light-sensitive layer is lower than light-sensitivity of the second light-sensitive layer.

The fifth embodiment of the invention provides a process for forming a circuit pattern, which comprises the steps of:

(1) exposing a light-sensitive laminate comprising a substrate for a printed circuit board, a second light-sensitive layer and a first light-sensitive layer in this order, wherein each of the first and second light sensitive layers independently contains a binder, a polymerizable compound and a photo-polymerization initiator, and wherein sensitivity of the first light-sensitive layer is lower than sensitivity of the second light-sensitive layer, to light corresponding to a circuit pattern from the first light-sensitive layer; and then (2) developing the light-sensitive laminate whereby the unhardened areas of the first and second light-sensitive layers are removed to form the circuit pattern comprising an area where the hardened areas of the first and second light-sensitive layers remain on the substrate, and an area where the substrate is bared by removing the unhardened areas of the first and second light-sensitive layers.

The fifth embodiment of the invention is preferably conducted as follows.

(a) The light-sensitive laminate is exposed to light at the step of (1) by scanning the light-sensitive laminate with a laser beam.

(b) The light-sensitive laminate comprises the substrate, the second light-sensitive layer, the first light-sensitive layer and a support in this order, and a step of removing the transparent support from the light-sensitive laminate is conducted between the steps (1) and (2).

The sixth embodiment of the invention provides a process for forming a circuit pattern, which comprises the steps of:

(1) exposing a light-sensitive laminate comprising a substrate having holes for a printed circuit board, a second light-sensitive layer and a first light-sensitive layer in this order, wherein each of the first and second light sensitive layers independently contains a binder, a polymerizable compound and a photo-polymerization initiator, to light having at least two different light exposure energy levels from the first light-sensitive layer to harden the first and second light-sensitive layers within the area corresponding to the holes and neighborhoods thereof exposed to light having a higher light exposure energy level and to harden the second light-sensitive layer within the area corresponding to a wire pattern exposed to light having a lower light exposure energy level; and then (2) developing the light-sensitive laminate whereby the unhardened areas of the first and second light-sensitive layers are removed to form the circuit pattern comprising an area where the hardened areas of the first and second light-sensitive layers remain on the substrate, an area where the hardened area of the second light-sensitive layers remains on the substrate, and an area where the substrate is bared by removing the unhardened areas of the first and second light-sensitive layers.

The sixth embodiment of the invention is preferably conducted as follows.

(a) The light-sensitive laminate is exposed to light at the step of (1) by scanning the light-sensitive laminate with a laser beam.

(b) The light-sensitive laminate comprises the substrate, the second light-sensitive layer, the first light-sensitive layer and a support in this order, and a step of removing the transparent support from the light-sensitive laminate is conducted between the steps (1) and (2).

(c) Light-sensitivity of the first light-sensitive layer is lower than light-sensitivity of the second light-sensitive layer.

The light-sensitive sheet or the light-sensitive laminate according to the present invention can form hardened areas which are different in thicknesses within desired areas by controlling an amount of applied light (amount of exposure). The light-sensitive sheet or the light-sensitive laminate according to the invention can form a hardened layer having a desired thickness within a desired area (namely, can form a three-dimensional image), can form an image having a desired transparency to light within a desired area (namely, can form an image having a desired density), or can form an image having a desired film-strength within a desired area. For example, a thick hardened area can be formed where the layer should have high film-strength. Further, an image pattern having a thin hardened layer can be formed where the image should have high resolution.

The light-sensitive sheet or the light-sensitive laminate according to the present invention can be advantageously used in producing a printed circuit board, particularly a printed circuit board having holes such as a through-hole and a via-hole. A relatively thin hardened layer giving high resolution can be formed according to the present invention within the area where wiring of the circuit pattern is located. A relatively thick hardened layer having high film-strength can be formed according to the present invention within the areas where the holes are located. Therefore, a printed circuit board of high resolution can be produced according to an industrially advantageous tenting process.

DETAILED DESCRIPTION OF THE INVENTION

Figure 1:
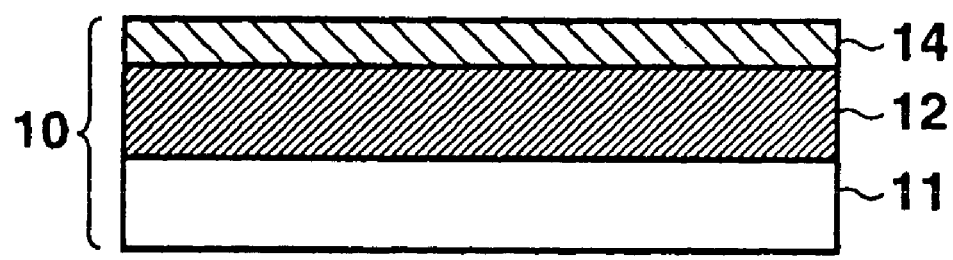
FIG. 1 is a sectional view schematically illustrating a light-sensitive sheet according to the invention comprising two light-sensitive layers.

FIG. 1 is a sectional view schematically illustrating a light-sensitive sheet comprising two light-sensitive layers.

As is shown in FIG. 1, a light-sensitive sheet 10 comprises a support 11, a first light-sensitive layer 12 and a second light-sensitive layer 14 in this order. Each of the first light-sensitive layer 12 and the second light-sensitive layer 14 independently comprises a light-sensitive resin composition containing a binder, a polymerizable compound and a photo-polymerization initiator. When the light-sensitive resin composition is exposed to light, the light-sensitive resin composition is hardened. The present invention is characterized in that the second light-sensitive layer 14 is more sensitive to light than the first light-sensitive layer 12. Sensitivity to light corresponds inversely to an amount of light energy (amount of exposure) required for completing hardening reaction of the layer. When the sensitivity is high, a small amount of light energy the layer is required for a hardening reaction. The definition that light-sensitivity of the second light-sensitive layer 14 is higher than light-sensitivity of the first light-sensitive layer 12 means that light energy required for completing hardening reaction of the second light-sensitive layer is smaller than light energy required for completing hardening reaction of the first light-sensitive layer. Light energy required for initiating hardening reaction of the second light-sensitive layer is preferably smaller than light energy required for initiating hardening reaction of the first light-sensitive layer.

Figure 2:
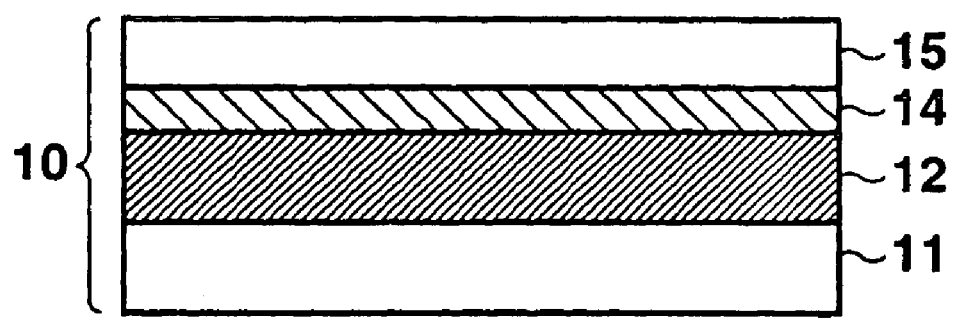
FIG. 2 is a sectional view schematically illustrating another light-sensitive sheet according to the invention comprising two light-sensitive layers.

FIG. 2 is a sectional view schematically illustrating a light-sensitive sheet comprising two light-sensitive layers and a protective film.

As is shown in FIG. 2, a light-sensitive sheet 10 comprises a support 11, a first light-sensitive layer 12, a second light-sensitive layer 14 and a protective film 15 in this order.

The first light-sensitive layer has a thickness preferably of 1 to 100 μm, more preferably of 5 to 80 μm, and most preferably of 10 to 50 μm.

The second light-sensitive layer has a thickness preferably of 0.1 to 15 μm, more preferably of 1 to 12 μm, and most preferably of 3 to 10 μm.

The thickness of the first light-sensitive layer is preferably larger than the thickness of the second light-sensitive layer.

The light-sensitive sheet further comprises layers other than those shown in FIG. 1 or 2. For example, an optional layer can be provided between the support 11 and the first light-sensitive layer 12 or between the protective film 15 and the second light-sensitive layer 14. Examples of the optional layers include a releasing or adhesion layer, an anti-halation layer or a barrier layer. The releasing or adhesion layer adjusts a releasing or adhesion forth between a layer and the support or the substrate. The barrier layer prevents penetration or diffusion of not only internal substances contained in the light-sensitive layers, the support or the protective film but also external substances such as oxygen and water.

Figure 3:
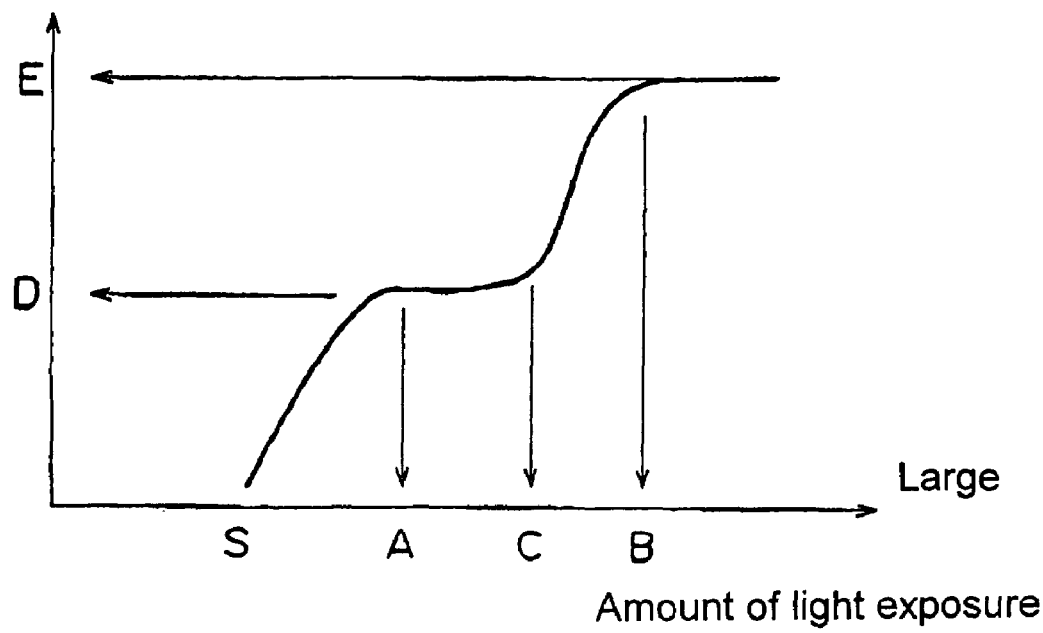
FIG. 3 is a graph showing a relation between thickness of the hardened layer and the amount of exposure when a light-sensitive sheet according to the invention is exposed to light incident upon the support-side.

FIG. 3 shows a relation between hardening of the light-sensitive layer and the amount of exposure when the light-sensitive sheet or the light-sensitive laminate is exposed to light.

The light-sensitive sheet of FIG. 1 (or a light-sensitive sheet obtained by peeling the protective film from the light-sensitive sheet of FIG. 2) is transferred to a substrate to form a light-sensitive laminate.

A light-sensitive laminate having a transparent support can be irradiated with light from an opposite side to the side of the substrate. The light-sensitive layers can be exposed to the light passed through the transparent support. The light-sensitive layers can be exposed to light from an opposite side to the side of the substrate after the transparent support is peeled from the light-sensitive laminate. FIG. 3 is a graph (sensitivity curve) showing a relation between the amount of light exposure and thickness of the hardened layer formed by developing treatment. In FIG. 3, the amount of light exposure is plotted on the horizontal axis. The thickness of the hardened layer obtained by exposing to light and subjecting to developing treatment is plotted on the vertical axis. The D on the vertical axis represents thickness of the hardened layer formed from only the second light-sensitive layer, and the E represents the total thickness of the hardened layers formed from both first and second light-sensitive layers.

In exposing the light-sensitive laminate to light, light travels through the first light-sensitive layer to the second light-sensitive layer. As shown in FIG. 3, a hardening reaction of the second light-sensitive layer preferably begins with a less amount of light energy earlier than a hardening reaction of the first light-sensitive layer. The first light-sensitive layer is preferably hardened with increasing the amount of light energy after the whole second light-sensitive layer is hardened. The whole first light-sensitive layer is hardened with further increasing the amount of light energy.

The ratio of light-sensitivity of the second light-sensitive layer to light-sensitivity of the first light-sensitive layer is preferably in the range of 2 to 200, more preferably in the range of 2.5 to 100, and most preferably in the range of 3 to 50.

The definition that light-sensitivity of the second light-sensitive layer is higher than light-sensitivity of the first light-sensitive layer means A<B, namely that light energy required for completing hardening reaction of the second light-sensitive layer (A) is smaller than light energy required for completing hardening reaction of the first light-sensitive layer (B). Light energy required for initiating hardening reaction of the second light-sensitive layer (S) is preferably smaller than light energy required for initiating hardening reaction of the first light-sensitive layer (C).

Light energy required for initiating the hardening reaction of the second light-sensitive layer (S) is preferably in the range of 0.05 to 10 mJ/cm$^2$, more preferably in the range of 0.1 to 5 mJ/cm$^2$, and most preferably in the range of 0.15 to 2.5 mJ/cm$^2$.

Light energy required for completing the hardening reaction of the second light-sensitive layer (A) is preferably in the range of 0.1 to 20 mJ/cm$^2$, more preferably in the range of 0.2 to 15 mJ/cm$^2$, and most preferably in the range of 0.4 to 10 mJ/cm$^2$.

Light energy required for initiating the hardening reaction of the first light-sensitive layer (C) is preferably larger than light energy required for completing the hardening reaction of the second light-sensitive layer (A).

The ratio (C/A) of light energy required for initiating the hardening reaction of the first light-sensitive layer (C) to light energy required for completing the hardening reaction of the second light-sensitive layer (A) is preferably in the range of 1 to 10, more preferably in the range of 1.1 to 9, and most preferably in the range of 1.3 to 8.

The light energy required for initiating the hardening reaction of the first light-sensitive layer (C) is preferably in the range of 0.1 to 200 mJ/cm$^2$, more preferably in the range of 1 to 100 mJ/cm$^2$, and most preferably in the range of 2 to 50 mJ/cm$^2$.

The ratio (A/B) of light energy required for completing the hardening reaction of the second light-sensitive layer (A) to light energy required for completing the hardening reaction of the first light-sensitive layer (B) is preferably in the range of 0.005 to 0.5, more preferably in the range of 0.01 to 0.4, and most preferably in the range of 0.02 to 0.35.

The light-sensitive layer preferably has appropriate absorption of light (or optical density) at the wave-length of light used at the step of exposing the light-sensitive laminate. The absorption of light is particularly important in an upper layer (namely the first light-sensitive layer), from which the light-sensitive laminate is exposed to light.

If the absorption of light (or optical density) of the first light-sensitive layer is high at the wavelength of light used at the step of exposing the light-sensitive laminate, the first light-sensitive layer might reduce the amount of light reaching the second light-sensitive layer. If the amount of light reaching the second light-sensitive layer is low, hardening reaction of the second light-sensitive layer might proceed insufficiently. In the case that absorption of light in the first light-sensitive layer is 0.3, transmittance of light in the first light-sensitive layer is 50%, and light reaching the second light-sensitive layer is 50% of light emitted from the light source. In the case that absorption of light in the first light-sensitive layer is 0.6, transmittance of light in the first light-sensitive layer is 25%, and light reaching the second light-sensitive layer is 25% of light emitted from the light source. In the case that absorption of light in the first light-sensitive layer is more than 0.1, transmittance of light in the first light-sensitive layer is less than 10%, and light scarcely reaches the second light-sensitive layer.

Accordingly, the absorption of light (or optical density) of the upper layer is preferably adjusted to keep the light-sensitivity of the lower layer.

The first light-sensitive layer has absorption of light preferably in the range of 0.1 to 1.0, more preferably in the range of 0.1 to 0.8, and most preferably in the range of 0.1 to 0.6 at wavelength of 405 nm.

The second light-sensitive layer has absorption of light preferably in the range of 0.1 to 1.5, more preferably in the range of 0.1 to 1.0.

The absorption of light can be controlled by adjusting an amount of a compound having the absorption maximum within a wavelength region of 380 to 430 nm, which preferably is a sensitizer.

The light-sensitive sheet can comprise three or more light-sensitive layers.

Figure 4:
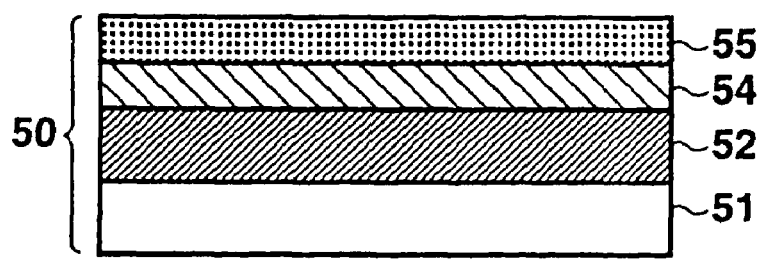
FIG. 4 is a sectional view schematically illustrating a further light-sensitive sheet according to the invention.

FIG. 4 is a sectional view schematically illustrating a light-sensitive sheet comprising three light-sensitive layers.

As is shown in FIG. 4, a light-sensitive sheet 50 comprises a support 51, a first light-sensitive layer 52, a second light-sensitive layer 54 and a third light-sensitive layer 55 in this order.

Figure 5:
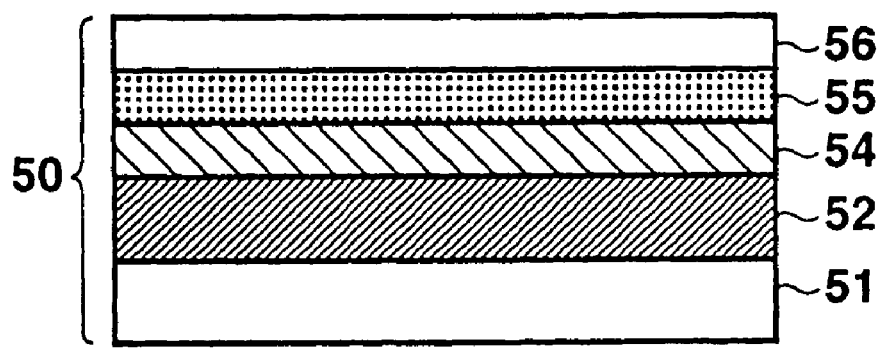
FIG. 5 is a sectional view schematically illustrating a furthermore light-sensitive sheet according to the invention.

FIG. 5 is a sectional view schematically illustrating a light-sensitive sheet comprising three light-sensitive layers and a protective film.

As is shown in FIG. 5, a light-sensitive sheet 50 comprises a support 51, a first light-sensitive layer 52, a second light-sensitive layer 54, a third light-sensitive layer 55 and a protective film 56 in this order.

A light-sensitive layer far from the support is preferably more sensitive to light than another light-sensitive layer near the support in a light-sensitive sheet comprising three light-sensitive layers. The third light-sensitive layer (which is the farthest from the support) preferably has the highest sensitivity. The second light-sensitive layer (which is positioned at a middle distance from the support) preferably has the second highest sensitivity. The first light-sensitive layer (which is the nearest to the support) preferably has the lowest sensitivity.

Figure 6:
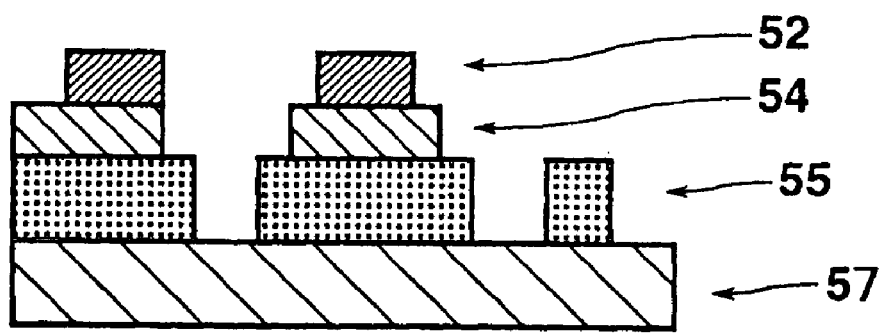
FIG. 6 is a sectional view schematically illustrating a patterned image (patterned hardened layer) formed from a light-sensitive sheet according to the invention comprising three light-sensitive layers.

FIG. 6 is a sectional view schematically illustrating a patterned image (patterned hardened layer) formed from the light-sensitive sheet comprising three light-sensitive layers.

The light-sensitive sheet comprising three light-sensitive layers shown in FIG. 4 or 5 is exposed to light with the light energy controlled according to a desired pattern. For example, the exposure is changed among three levels X, Y and Z. On an area where only the third light-sensitive layer is to be hardened, the light is applied in the smallest exposure amount X. On another area where the third and second light-sensitive layers are both to be hardened, the light is applied in the middle exposure amount Y. On still another area where all the third, second and first light-sensitive layers are to be hardened, the light is applied in the largest exposure amount Z. A pattern having three different thicknesses can be formed on a substrate 57 from one light-sensitive sheet, as is shown in FIG. 6. The pattern consists of an area where only the third light-sensitive layer 55 is hardened, an area where the third and second light-sensitive layers 55, 54 are both hardened and an area where all the third, second and first light-sensitive layers 55, 54, 52 are hardened, as is shown in FIG. 6.

A pattern having four or more different thicknesses can be prepared from one light-sensitive sheet having four or more light-sensitive layers. Sensitivities of the four or more light-sensitive layers are preferably increased according to distance from the transparent support.

The light-sensitive sheet according to the present invention can form a hardened layer having desired thicknesses by the steps of exposure and development. The thickness of the hardened layer can be optionally controlled by changing the amount of exposure (amount of light energy). The amount of exposure is changed according to the image pattern. The pattern can comprise an area where only one light-sensitive layer nearest to the substrate can be hardened, an area where a desired number of the light-sensitive layers are hardened and an area where all the light-sensitive layers are hardened. Accordingly, one light-sensitive sheet according to the invention can form hardened areas having desired different thicknesses within desired areas, can form an image having desired different film-strength within desired areas, or can form an image having desired different color densities within desired areas.

The light-sensitive sheet according to the invention is advantageously used for preparation of a printed circuit board, particularly a printed circuit board having a through-hole or a via-hole. The light-sensitive sheet according to the invention can form a thin hardened layer with high resolution within an area where wiring of the circuit pattern is positioned. The light-sensitive sheet according to the invention can also form a thick hardened layer having high film-strength within an area where the through-hole or via-hole is positioned. The light-sensitive sheet according to the invention can form a hardened resin pattern having a film-strength to be used in the tenting process. The light-sensitive sheet according to the invention can also form a hardened resin pattern with high resolution.

A light-sensitive sheet having a sensitivity curve shown in FIG. 3 comprises light-sensitive layers in which sensitivities of the light-sensitive layers are increased with increasing the distance of the light-sensitive layers from the support. All the known sensitizing techniques can be used to make the two or more light-sensitive layers having different light-sensitivities. For example, a highly sensitive photo-polymerization initiator can be used to increase the light-sensitivity. A highly sensitive sensitizer can also be used to form a highly light-sensitive layer. An amount of the photo-polymerization initiator or the sensitizer can be increased to increase the light-sensitivity. A content of a polymerizable compound in a light-sensitive layer can be increased to increase the light-sensitivity. Further, an amount of a polymerization inhibitor or a polymerization retarder can be reduced to obtain a relatively high light-sensitivity. In the case where the light-sensitive sheet has two light-sensitive layers, the highly sensitive photo-polymerization initiator or the sensitizer can be incorporated in the second light-sensitive layer. The photo-polymerization initiator or sensitizer can be more incorporated in the second light-sensitive layer than in the first light-sensitive layer. Further, the polymerizable compound can be more incorporated in the second light-sensitive layer than in the first light-sensitive layer.

[Binder]

The binder contained in a light-sensitive layer is preferably soluble or swollen in an alkaline aqueous solution. A binder soluble or swollen in an alkaline aqueous solution generally is a polymer having an acidic group (e.g., carboxylic acid group, sulfonic acid group, phosphoric acid group). The binder preferably is a polymer having carboxyl. The acidic group can be dissociated or in the form of a salt.

A main chain of the polymer preferably comprises a vinyl polymer, polyolefin, polyurethane, polyamide (including polyamic acid) or epoxy resin (including denatured epoxy resin). The binder preferably is a vinyl polymer having carboxylic acid group because it has adequate solubility in a coating solvent and in a developing solution, because it can be easily prepared, and because characters of a film prepared from it can be easily controlled. The vinyl polymer can be used in combination with other polymers (e.g., polyester, polyamide, polyurethane, epoxy resin, polyvinyl alcohol, gelatin).

The vinyl polymer having carboxylic acid group preferably is a copolymer of (1) vinyl monomer having carboxylic acid group and (2) vinyl monomer not having carboxylic acid group.

(1) Examples of the vinyl monomers having carboxylic acid groups include (meth)acrylic acid, vinylbenzoic acid, maleic acid, monoalkyl maleate, fumaric acid, itaconic acid, crotonic acid, cinnamic acid, and acrylic acid dimer. The vinyl monomers having carboxylic acid groups further includes ω-carboxy-polycaprolactone mono(meth)acrylate or an addition product between monomer having hydroxyl (e.g., 2-hydroxyetnyl (meth)acrylate) and cyclic acid anhydride (e.g., maleic anhydride, phthalic anhydride, cyclohexanedicarboxylic anhydride). A precursor of a vinyl monomer having carboxylic acid group, such as a vinyl monomer having a carboxylic anhydride (e.g., maleic anhydride, itaconic anhydride, citraconic anhydride) can be used in place of the vinyl monomer having carboxylic group. The vinyl monomer having carboxylic acid group most preferably is (meth)acrylic acid in consideration of practical conditions such as copolymerization character, cost and solubility.

(2) Examples of the vinyl monomers not having carboxylic acid groups include (meth)acrylic esters, crotonic esters, vinyl esters, maleic diesters, fumaric diesters, itaconic diesters, (meth)acrylamides, vinyl ethers, esters of vinyl alcohols, styrene, substituted styrenes, (meth)acrylonitrile, vinyl-substituted heterocyclic compounds, N-vinylamide, sulfonic acids having vinyl, phosphoric esters having vinyl, urethanes having vinyl, ureas having vinyl, sulfonamides having vinyl, phenols having vinyl, and imides having vinyl.

Examples of the (meth)acrylic esters include methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, hexyl (meth)acrylate, cyclohexyl (meth)acrylate, t-butylcyclohexyl (meth)acrylate, 2-ethylhexyl (meth)acrylate, t-octyl (meth)acrylate, dodecyl (meth)acrylate, octadecyl (meth)acrylate, acetoxyethyl (meth)acrylate, phenyl (meth)acrylate, 2-hydroxyethyl (meth)acrylate, 2-methoxy-ethyl (meth)acrylate, 2-ethoxyethyl (meth)acrylate, 2-(2-methoxyethoxy)ethyl (meth)acrylate, 3-phenoxy-2-hydroxy-propyl (meth)acrylate, benzyl (meth)acrylate, diethylene glycol monomethyl ether (meth)acrylate, diethylene glycol monoethyl ether (meth)acrylate, diethylene glycol monophenyl ether (meth)acrylate, triethylene glycol monomethyl ether (meth)acrylate, triethylene glycol monoethyl ether (meth)acrylate, polyethylene glycol monomethyl ether (meth)acrylate, polyethylene glycol monoethyl ether (meth)acrylate, β-phenoxyethoxyethyl acrylate, nonylphenoxy polyethylene glycol (meth)acrylate, dicyclopentanyl (meth)acrylate, dicyclopentenyl (meth)acrylate, dicyclopentenyloxyethyl (meth)acrylate, trifluoroethyl (meth)acrylate, octafluoropentyl (meth)acrylate, perfluorooctylethyl (meth)acrylate, tri-bromophenyl (meth)acrylate, and tribromophenyloxyethyl (meth)acrylate.

Examples of the crotonic esters include butyl crotonate and hexyl crotonate.

Examples of the vinyl esters include vinyl acetate, vinyl propionate, vinyl butylate, vinyl methoxyacetate and vinyl benzoate.

Examples of the maleic diesters include dimethyl maleate, diethyl maleate and dibutyl maleate.

Examples of the fumaric diesters include dimethyl fumarate, diethyl fumarate and dibutyl fumarate.

Examples of the itaconic diesters include dimethyl itaconate, diethyl itaconate and dibutyl itaconate.

Examples of the (meth)acrylamides include (meth)acrylamide, N-methyl(meth)acrylamide, N-ethyl(meth)acrylamide, N-propyl(meth)acrylamide, N-isopropyl(meth)acrylamide, N-butyl(meth)acrylamide, N-t-butyl (meth)acrylamide, N-cyclohexyl(meth)acrylamide, N-(2-methoxyethyl)(meth)acrylamide, N,N-dimethyl(meth)acrylamide, N,N-diethyl(meth)acrylamide, N-phenyl(meth)acrylamide, N-benzyl(meth)acrylamide, (meth)acryloylmorpholine, and diacetone acrylamide.

Examples of the substituted styrenes include methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected with a group (e.g., t-Boc) capable of being eliminated by acidic substance, methyl vinylbenzoate and α-methylstyrene.

Examples of the vinyl ethers include methyl vinyl ether, butyl vinyl ether, hexyl vinyl ether and methoxyethyl vinyl ether.

Examples of the vinyl-substituted heterocyclic compounds include vinylpyridine, vinylpyrrolidone, vinylcarbazole, N-vinylimidazole, and vinylcaprolactone.

Examples of the N-vinylamides include N-vinylformamide and N-vinylacetamide.

Examples of the sulfonic acids having vinyl include 2-acrylamide-2-methylpropanesulfonic acid.

Examples of the phosphoric esters having vinyl include mono(2-acryloyloxyethyl) phosphate and mono(1-methyl-2-acryloyloxyethyl) phosphate.

The urethane or urea having vinyl can be synthesized by an addition reaction of an isocyanate with a compound having hydroxyl (alcohol, phenol), a primary amine or a secondary amine. Vinyl can be contained in the isocyanate, the compound having hydroxyl (alcohol, phenol), the primary amine or the secondary amine. In other words, an isocyanate having vinyl, a compound having vinyl and hydroxyl, a primary amine having vinyl or a secondary amine having vinyl can be used in the reaction.

Examples of the isocyanates having vinyl are represented by the following formulas.

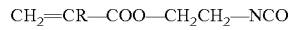

CH$_2$=CR—COO—CH$_2$CH$_2$—NCO

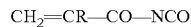

CH$_2$=CR—CO—NCO

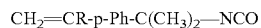

CH$_2$=CR-p-Ph-C(CH$_3$)$_2$—NCO

In the formulas, R is hydrogen or methyl, and p-Ph is 1,4-phenylene.

Examples of the isocyanates not having vinyl include cyclohexyl isocyanate, butyl isocyanate, toluyl isocyanate, benzyl isocyanate and phenyl isocyanate.

The compound having both vinyl and hydroxyl is preferably one of the compounds represented by the following formulas.

CH$_2$=CR—CO(—O—CH$_2$CH$_2$—)$_n$OH

CH$_2$=CR—CO(—O—CH$_2$CH(CH$_3$)—)$_n$OH

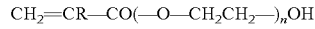

CH$_2$=CR-p-Ph-OH

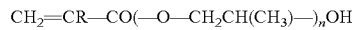

CH$_2$=CR—CO—NH-p-Ph-OH

CH$_2$=CR—CO—O—CH$_2$—CHOH—CH$_3$

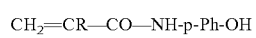

In the formulas, R is hydrogen or methyl, p-Ph is 1,4-phenylene, and n is an integer of 1 or more.

Examples of the alcohols not having vinyl include methanol, ethanol, propanol, isopropanol, butanol, sec-butanol, t-butanol, hexanol, 2-ethylhexanol, decanol, dodecanol, octadecanol, cyclopentanol, cyclohexanol, benzyl alcohol and phenylethyl alcohol. Examples of the substituted alcohols not having vinyl include trifluoroethanol, methoxyethanol and phenoxyethanol. Examples of the phenols not having vinyl include phenol, cresol and naphthol. Examples of the substituted phenols not having vinyl include chlorophenol, dichlorophenol, methoxyphenol and acetoxyphenol.

Examples of the amines having vinyl include vinylbenzylamine.

Examples of the amines not having vinyl include alkylamines (e.g., methylamine, ethylamine, propylamine, isopropylamine, butylamine, sec-butylamine, t-butylamine, hexylamine, 2-ethylhexylamine, decylamine, dodecylamine, octadecylamine, dimethylamine, diethylamine, dibutylamine, dioctylamine), cyclic alkylamines (e.g., cyclopentylamine, cyclohexylamine), aralkylamines (e.g., benzylamine, phenetylamine), arylamines (e.g., aniline, toluylamine, xylylnaphthyl amine), N-methyl-N-benzylamine, substituted alkyl-amines (e.g., trifluoroethylamine, hexafluoroisopropylamine, methoxypropylamine) and substituted arylamines (e.g., methoxyaniline).

(2) Vinyl monomer not having carboxyl preferably is methyl (meth)acrylate, ethyl (meth)acrylate, butyl (meth)acrylate, benzyl (meth)acrylate, 2-ethylhexyl (meth)acrylate, styrene, chlorostyrene, bromostyrene or hydroxystyrene.

The vinyl polymer can be synthesized, for example according to a solution polymerization process, which comprises the steps of dissolving a corresponding monomer in a appropriate solvent to form a solution, adding a radical polymerization initiator to the solution, and polymerizing the monomer in the solution. The polymer can also be synthesized according to an emulsion polymerization process, which comprises the steps of dispersing or emulsifying the monomer in an aqueous medium to prepare a dispersion or emulsion and polymerizing the monomer in the dispersion or emulsion.

Examples of the solvents used in the solution polymerization process include alcohols (e.g., methanol, ethanol, propanol, isopropanol, 1-methoxy-2-propanol), ketones (e.g., acetone, methyl ethyl ketone, methyl isobutyl ketone), esters (e.g., methoxypropyl acetate, ethyl lactate, ethyl acetate), nitriles (e.g., acetonitrile), ethers (e.g., tetrahydrofuran), amides (e.g., dimethyl formamide), halogenated hydrocarbons (e.g., chloroform) and hydrocarbons (e.g., toluene). Two or more solvents can be mixed to be used in the solution polymerization process.

Examples of the radical polymerization initiators include azo compounds (e.g., 2,2'-azobisisobuthylonitrile (AIBN), 2.2'-azobis-2,4'-dimethylvaleronitrile), peroxides (e.g., benzoyl peroxide) and persulfates (e.g., potassium persulfate, ammonium persulfate).

In that case that a copolymer used as a binder, the copolymer used in any light-sensitive layer comprises a repeating unit having carboxyl in an amount preferably of 5 to 50 mol. %, more preferably of 10 to 40 mol. %, and most preferably of 15 to 35 mol. %, based on the total amount of all the repeating units.

The polymer has a weight average molecular weight preferably of 2,000 to 300,000, and more preferably of 4,000 to 150,000.

Two or more polymers can be used in combination as a binder. The two or more polymers can differ in the components, in the weight average molecular weight or in the dispersion.

Japanese Patent No. 2,873,889 describes resins soluble in an alkaline aqueous solution, which can be used in the light-sensitive layer.

The content of binder in any light-sensitive layer is preferably in the range of 10 to 90 wt. %, more preferably in the range of 20 to 80 wt. %, and most preferably in the range of 40 to 80 wt. %.

The content of the binder in the second light-sensitive layer can be smaller than the content of the binder in the first light-sensitive layer. In place of the binder, the content of polymerizable compound in the second light-sensitive layer can be larger than the content of the polymerizable compound the binder in the first light-sensitive layer to control the sensitivity.

[Polymerizable Compound]

The polymerizable compound include a compound of a high molecular weight (oligomer, polymer) as well as a compound of a low molecular weight (monomer).

The polymerizable compound preferably has a ring-opening polymerizable group or an addition polymerizable group. An addition polymerizable group is more preferred, and an ethylenically unsaturated group is most preferred.

The polymerizable compound preferably has two or more polymerizable groups.

The polymerizable compound can be categorized into a polymerizable urethane compound, a polymerizable aromatic compound or a polymerizable aliphatic compound.

The polymerizable urethane compound has at least one polymerizable group and at least one urethane bond (—NH—CO—O—) in its molecular structure.

The polymerizable urethane compound is described in Japanese Patent Publication Nos. 48(1973)-41708, 5(1993)-50737, 7(1995)-7208 and Japanese Patent Provisional Publication Nos. 51(1976)-37193, 2001-154346 and 2001-356476.

The urethane bond is generally formed by a reaction of isocyanate with alcohol or phenol. The alcohol or phenol preferably has a polymerizable group.

The isocyanate is preferably a polyisocyanate having two or more isocyanate groups in its molecular structure. Examples of the diisocyanate include hexamethylene diisocyanate, trimethylhexamethylene diisocyanate, isophorone diisocyanate, xylene diisocyanate, toluene diisocyanate, phenylene diisocyanate, norbornane diisocyanate, diphenyl diisocyanate, diphenylmethane diisocyanate and 3,3'-dimethyl-4,4'-diphenyl diisocyanate. Further, a product of polyaddition between diisocyanate and difunctional alcohol (the product has a molecular structure in which isocyanate group is positioned at each end) can be used as the isocyanate. A trimer of diisocyanate (e.g., isocyanurate) or an addition product between diisocyanate and a polyfunctional alcohol (e.g., trimethylol propane, pentaerythritol, glycerol) can be also used as the polyisocyanate. The polyfunctional alcohol can be an addition product with an alkylene oxide (e.g., ethylene oxide).

Examples of the alcohols having a polymerizable group include 2-hydroxyethyl (meth)acrylate, 2-hydroxypropyl (meth)acrylate, 4-hydroxybutyl (meth)acrylate, polyalkylene glycol mono(meth)acrylate, trimethylolpropane di(meth)acrylate and pentaerythritol (meth)acrylate. Examples of the polyalkylene glycol mono(meth)acrylate include diethylene glycol mono(meth)acrylate, triethylene glycol mono(meth)acrylate, tetraethylene glycol mono (meth)acrylate, octaethylene glycol mono(meth)acrylate, dipropylene glycol mono(meth)acrylate, tripropylene glycol mono(meth)acrylate, tetrapropylene glycol mono(meth) acrylate, octapropylene glycol mono(meth)acrylate, dibutylene glycol mono(meth)acrylate, tributylene glycol mono (meth)acrylate, tetrabutylene glycol mono(meth)acrylate and octabutylene glycol mono(meth)acrylate. The polyalkylene glycol mono(meth)acrylate can contain a polyalkylene glycol moiety, which can be a copolymer comprising different alkylene oxide units (for example, ethylene oxide and propylene oxide). The copolymer can be a random, block or alternative copolymer.

The polymerizable urethane compound can be a compound having isocyanurate ring, such as tri((meth)acryloyloxy-ethyl) isocyanurate, di(meth)acrylized isocyanurate, tri(meth)acrylate derived from ethylene oxide-denatured isocyanuric acid.

The polymerizable aromatic compound has at least one polymerizable group and at least one aromatic ring in its molecular structure.

The polymerizable aromatic compound is categorized into a monofunctional polymerizable aromatic compound or a polyfunctional polymerizable aromatic compound.

The polyfunctional polymerizable aromatic compound is preferred to the monofunctional polymerizable aromatic compound.

Preferred examples of the polyfunctional polymerizable aromatic compounds include esters of carboxylic acids having ethylenically unsaturated groups with polyhydric phenols or polyhydric alcohols, amides of carboxylic acids having ethylenically unsaturated groups with polyfunctional amines, urethanes of polyhydric phenols with ethylenically unsaturated isocyanates, addition products of carboxylic acids having ethylenically unsaturated groups with polyfunctional glycidyl compounds, addition products of polyvalent isocyanates with ethylenically unsaturated alcohols, esters of polyfunctional acids with ethylenically unsaturated alcohols, aromatic compounds having two or more ethylenically unsaturated groups, and esters of carboxylic acids having ethylenically unsaturated groups with alcohols having ethylenically unsaturated groups.

The polyfunctional polymerizable aromatic compound more preferably is an ester of carboxylic acid having ethylenically unsaturated group with polyhydric phenol or polyhydric alcohol (an ester of carboxylic acid having ethylenically unsaturated group with polyhydric phenol, an ester of carboxylic acid having ethylenically unsaturated group with polyhydric aromatic alcohol or an ester of aromatic carboxylic acid having ethylenically unsaturated group with polyhydric alcohol), or an amide of carboxylic acid having ethylenically unsaturated group with polyfunctional amine (an amide of carboxylic acid having ethylenically unsaturated group with polyfunctional aromatic amine or an amide of aromatic carboxylic acid having ethylenically unsaturated group with polyfunctional amine).

The polyfunctional polymerizable aromatic compound further preferably is an ester of carboxylic acid having ethylenically unsaturated group with polyhydric phenol, an ester of carboxylic acid having ethylenically unsaturated group with polyhydric aromatic alcohol, or an amide of carboxylic acid having ethylenically unsaturated group and polyfunctional aromatic amine.

Examples of the polyhydric phenols and the polyhydric aromatic alcohols include polystyrene oxide, xylenediol, di(β-hydroxyethoxy)benzene, 1,5-dihydroxy-1,2,3,4-tetrahydro-nathphalene, 2,2-diphenyl-1,3-propanediol, hydroxybenzyl alcohol, hydroxyethyl resorcinol, 1-phenyl-1,2-ethanediol, 2,3,5,6-tetramethyl-p-xylene-α,α'-diol, 1,1,4,4-tetra-phenyl-1,4-butanediol, 1,1,4,4-tetraphenyl-2-butine-1,4-diol, 1,1'-bi(2-naphthol), dihydroxynephthalene, 1,1'-methylene-di-2-naphthol, 1,2,4-benzenetriol, biphenol, 2,2'-bis(4-hydroxyphenyl)butane, 1,1-bis(4-hydroxyphenyl)-cyclohexane, bis(hydroxyphenyl)methane, catechol, 4-chloro resorcinol, hydroquinone, hydroxybenzyl alcohol, methyl-hydroquinone, methylene-2,4,6-trihydroxybenzoate, fluoroglycinol, pyrogallol, resorcinol, α-(1-aminoethyl)-p-hydroxybenzyl alcohol, and 3-amino-4-hydroxyphenyl sulfone.

The polymerizable aromatic compound can have a bisphenol structure. Examples of the polymerizable aromatic compounds having the bisphenol structure include 2,2-bis(4-(3-(meth)acryloyloxy-2-hydroxypropoxy)phenyl)propane, 2,2-bis(4-((meth)acryloyloxyethoxy)phenyl)propane, 2,2-bis(4-((meth)acryloyloxypoly(2-20)ethoxy)phenyl)propane (e.g., 2,2-bis(4-((meth)acryloyloxydiethoxy)phenyl)propane, 2,2-bis(4-((meth)acryloyloxytetraethoxy)phenyl)propane, 2,2-bis(4-((meth)acryloyloxypentaethoxy)phenyl)propane, 2,2-bis(4-((meth)acryloyloxydecaethoxy)phenyl)propane, 2,2-bis(4-((meth)acryloyloxypentadecaethoxy)phenyl)propane), 2,2-bis(4-((meth)acryloyloxypropoxy)phenyl)propane, and 2,2-bis(4-((meth)acryloyloxypoly(2-20)propoxy)phenyl)propane (e.g., 2,2-bis(4-((meth)acryloyloxydipropoxy)phenyl)propane, 2,2-bis(4-((meth)acryloyloxytetrapropoxy)phenyl)propane, 2,2-bis(4-((meth)acryloyloxypentapropoxy)phenyl)propane, 2,2-bis(4-((meth)acryloyloxydecapropoxy)phenyl)propane, 2,2-bis(4-((meth)acryloyloxypentadecapropoxy)phenyl)propane).

The polyether moiety can comprise the polyethylene oxide structure and the polyethylene propylene structure (for example, compounds disclosed in International Publication Pamphlet No. 01/98832). The polymerizable aromatic compound having the bisphenol structure is commercially available (for example, BPE-200, BPE-500, BPE-1000, Shin Nakamura Chemicals Co., Ltd).

The polymerizable aromatic compounds further include a polymerizable compound having a bisphenol structure and a urethane group. The polymerizable compounds having a bisphenol structure and a urethane group include a compound obtained by adding an isocyanato group and a polymerizable group to a compound having hydroxyl at the end of the molecular structure (e.g., 2-isocyanatoethyl (meth) acrylate, α,α-dimethylvinylbenzyl isocyanate).

The polymerizable aliphatic compound is categorized into a monofunctional polymerizable aliphatic compound or a polyfunctional polymerizable aliphatic compound.

The polyfunctional polymerizable aliphatic compound is preferred to the monofunctional polymerizable aliphatic compound.

Examples of the polyfunctional polymerizable aliphatic compound include esters of aliphatic carboxylic acids having ethylenically unsaturated groups with polyhydric alcohols, amides of aliphatic carboxylic acids having ethylenically unsaturated groups with polyfunctional aliphatic amines, addition products of aliphatic carboxylic acids having ethylenically unsaturated groups with polyvalent aliphatic glycidyl compounds, addition products of polyvalent aliphatic isocyanates with ethylenically unsaturated alcohols, esters of polyfunctional aliphatic acids with ethylenically unsaturated alcohols, divinyl ethers, and esters of aliphatic carboxylic acids having ethylenically unsaturated groups with alcohols having ethylenically unsaturated groups.

The polyfunctional polymerizable aliphatic compound more preferably is an ester of aliphatic carboxylic acid having ethylenically unsaturated group (unsaturated fatty acid) with polyhydric aliphatic alcohol or an amide of aliphatic carboxylic acid (unsaturated fatty acid) having ethylenically unsaturated group with polyacidic aliphatic amine.

Examples of the aliphatic carboxylic acids having ethylenically unsaturated group (unsaturated fatty acid) include acrylic acid, methacrylic acid, itaconic acid, crotonic acid, isocrotonic acid, and maleic acid.

Examples of the polyhydric aliphatic alcohols include ethylene glycol, poly(2-18)ethylene glycol, propylene glycol, poly(2-18)propylene glycol, neopentyl glycol, neopentyl glycol denatured with ethylene oxide, neopentyl glycol denatured with propylene oxide, trimethylolpropane tri(hydroxypropyl) ether, trimethylolethane, 1,3-propanediol, methylene glycol, 1,4-cyclohexanediol, 1,2,4-butanetriol, 1,5-pentanediol, pentaerythritol, dipentaerythritol, sorbitol, dimethyloldicyclopentane, tricyclodecanediol, neopentyl glycol, trimethylolpropane denatured with neopentyl glycol, an addition product of trimethylolpropane with ethylene oxide, polybutylene glycol and glycerol.

Examples of the esters of (meth)acrylic acid with polyhydric aliphatic alcohol include ethylene glycol di(meth)acrylate, poly(2-18)ethylene glycol di(meth)acrylate, propylene glycol di(meth)acrylate, poly(2-18)propylene glycol di(meth)acrylate, neopentyl glycol di(meth)acrylate, ethylene oxide-denatured neopentyl glycol di(meth)acrylate, propylene oxide-denatured neopentyl glycol di(meth)acrylate, trimethylolpropanetri(meth)acrylate, trimethylolpropane di(meth)acrylate, trimethylolpropane tri((meth)acryloyloxypropyl) ether, trimethylolethane tri(meth)acrylate, 1,3-propanediol di(meth)acrylate, 1,3-butanediol di(meth)acrylate, 1,4-butanediol di(meth)acrylate, 1,6-hexanediol di(meth)acrylate, tetra-methylene glycol di(meth)acrylate, 1,4-cyclohexanediol di(meth)acrylate, 1,2,4-butanetriol tri(meth)acrylate, 1,5-pentanediol (meth)acrylate, pentaerythritol di(meth)acrylate, pentaerythritol tri(meth)acrylate, pentaerythritol tetra(meth)acrylate, dipentaerythritol penta(meth)acrylate, dipentaerythritol hexa(meth)acrylate, sorbitol tri(meth)acrylate, sorbitol tetra(meth)acrylate, sorbitol penta(meth)acrylate, sorbitol hexa(meth)acrylate, dimethyloldicyclopentanedi(meth)acrylate, tricyclodecanedi(meth)acrylate, neopentyl glycol di(meth)acrylate, and trimethylolpropane di(meth)acrylate denatured with neopentyl glycol.

Examples of the poly(2-18)ethylene glycol di(meth)acrylates include diethylene glycol di(meth)acrylate, triethylene glycol di(meth)acrylate, tetraethylene glycol di(meth)acrylate, nonaethylene glycol di(meth)acrylate, dodecaethylene glycol di(meth)acrylate, and tetradecaethylene glycol di(meth)acrylate.

Examples of the poly(2-18)propylene glycol di(meth)acrylates include dipropylene glycol di(meth)acrylate, tripropylene glycol di(meth)acrylate, tetrapropylene glycol di(meth)acrylate, dodecapropylene glycol di(meth)acrylate Examples of the other esters include a tri(meth)acrylic ester of addition product of trimethylolpropane with ethylene oxide, polybutylene glycol di(meth)acrylate, glycerol di(meth)acrylate, and glycerol tri(meth)acrylate.

Examples of the ester of (meth)acrylic acid and polyhydric aliphatic alcohol further include di(meth)acrylate of alkylene glycol having ethylene glycol chain and propylene glycol chain (disclosed in International Publication Pamphlet No. 01/98832).

The ester of (meth)acrylic acid with polyhydric aiiphatic alcohol preferably is ethylene glycol di(meth)acrylate, polyethylene glycol di(meth)acrylate, propylene glycol di(meth)acrylate, polypropylene glycol di(meth)acrylate, di(meth)acrylate of alkylene glycol having ethylene glycol chain and propylene glycol chain, trimethylolpropane tri(meth)acrylate, pentaerythritol tetra(meth)acrylate, pentaerythritol tri(meth)acrylate, pentaerythritol di(meth)acrylate, dipentaerythritol penta(meth)acrylate, dipentaerythritol hexa(meth)acrylate, glycerol tri(meth)acrylate, diglycerol di(meth)acrylate, 1,3-propanediol di(meth)acrylate, 1,2,4-butanetriol tri(meth)acrylate, 1,4-cyclohexanediol di(meth)acrylate, 1,5-pentanediol (meth)acrylate, neopentyl glycol di(meth)acrylate, or tri(meth)acrylic ester of addition product of trimethylolpropane with ethylene oxide.

The polyhydric aliphatic alcohol can have a molecular structure in which the hydroxyls are positioned at both ends of the polyester chain. Japanese Patent Provisional Publication No. 48(1973)-64183, Japanese Patent Publication Nos. 49(1974)-43191 and 52(1977)-30490 describe the (meth)acrylic polyesters and the oligomers thereof.

The polyhydric aliphatic alcohol include an alcohol of aliphatic heterocyclic compound. Examples of the esters of (meth)acrylic acid with alcohol of aliphatic heterocyclic compound include tri((meth)acryloyloxyethyl) isocyanurate, isocyanuric di(meth)acrylate, and ethylenoxide-denatured isocyanuric di(meth)acrylate.

Examples of the esters of itaconic acid with polyhydric aliphatic alcohol include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the esters of crotonic acid with polyhydric aliphatic alcohol include ethylene glycol dicrotonate, tetramethylene glycol dicrotonate, pentaerythritol dicrotonate, and sorbitol tetracrotonate.

Examples of the esters of isocrotonic acid with polyhydric aliphatic alcohol include ethylene glycol diisocrotonate, pentaerythritol diisocrotonate, and sorbitol tetraisocrotonate.

Examples of the esters of maleic acid with polyhydric aliphatic alcohol include ethylene glycol dimalate, triethylene glycol dimalate, pentaerythritol dimalate, and sorbitol tetramalate.

Examples of the amides of aliphatic carboxylic acid having ethylenically unsaturated group with polyacidic aliphatic amine include methylenebis(meth)acrylamide, ethylenebis(meth)acrylamide, 1,6-hexamethylenebis(meth)acrylamide, octamethylene-bis(meth)acrylamide, diethylentriaminetris(meth)acrylamide, and diethylentriaminebis(meth)acryl-amide.

Examples of the addition products of carboxylic acid having ethylenically unsaturated group with polyfunctional glycidyl compound include butanediol-1,4-diglycidyl ether, cyclohexanedimethanolglycidyl ether, ethylene glycol diglycidyl ether, diethylene glycoldiglycidyl ether, dipropylene glycoldiglycidyl ether, hexanedioldiglycidyl ether, trimethylolpropanetriglycidyl ether, pentaerythritol tetraglycidyl ether, and glycerol-triglycidyl ether.

The ester of polyhydric fatty acid with ethylenically unsaturated alcohol preferably is an ester of allyl alcohol or vinyl alcohol.

Examples of the esters of allyl alcohol include diallyl adipate, diallyl malonate, and triallyl isocyanurate.

Examples of the esters of vinyl alcohol include divinyl succinate, divinyl adipate, divinylbutane-1,4-disulfonate.

Examples of the aliphatic divinyl ethers include butamediol-1.4-divinyl ether, cyclohexanedimethanoldivinyl ether, ethylene glycoldivinyl ether, diethylene glycoldivinyl ether, dipropylene glycoldivinyl ether, hexanedioldivinyl ether, trimethylolpropanetrivinyl ether, pentaerythritoltetravinyl ether, and glyceroltrivinyl ether. The divinyl ether behaves as not only a ring-opening polymerizable compound (e.g., epoxy compound) but also a cationic polymerizable compound.

Examples of the ester of aliphatic carboxylic acid having ethylenically unsaturated group and aliphatic alcohol having ethylenically unsaturated group include N-β-hydroxyethyl-β-(methacrylamide)ethylacrylate, N,N-bis(β-methacryloyloxyethyl)acrylamide, and allyl methacryalte.

Examples of the polyfunctional polymerizable aliphatic compound other than the ethylenically unsaturated polymerizable compound include epoxy compounds (e.g., butanediol-1,4-diglycidyl ether, cyclohexanedimethanoldiglycidyl ether, ethylene glycoldiglycidyl ether, diethylene glycoldiglycidyl ether, dipropylene glycoldiglycidyl ether, hexanedioldiglycidyl ether, trimethylolpropanetriglycidyl ether, pentaerythritoltetraglycidyl ether, and glyceroltriglycidyl ether. The epoxy compounds are described in International Patent Publication No. 01/22165.

Each light-sensitive layer contains the polymerizable compound preferably in an amount of 5 to 90 wt. %, more preferably in an amount of 15 to 70 wt. %, and most preferably in an amount of 20 to 60 wt. %.

Two or more polymerizable compounds can be used in combination. A polyfunctional polymerizable compound is contained preferably in an amount of 5 wt. % or more, more preferably 20 wt. % or more, and most preferably 40 wt. % or more based on the total amount of the polymerizable compound.

The amount of the polymerizable compound contained in the second light-sensitive layer can be larger than the first light-sensitive layer to control the sensitivities of the layers.

[Photo-polymerization Initiator]

The photo-polymerization initiator is preferably sensitive to light within the ultraviolet to visible region. The photo-polymerization initiator preferably contains a component having a molar extinction coefficient of 50 or more in the wavelength region of 300 to 800 nm. The wavelength region is preferably in the range of 330 to 500 nm. The photo-polymerization initiator can be an activator that reacts with photo-excited sensitizer to give an active radical. The photo-polymerization initiator includes a cationic polymerization initiator, which initiates the cationic polymerization of polymerizable compound.

Examples of the photo-polymerization initiators include triazine compounds having halogennated hydrocarbon groups, oxadiazole compounds having halogenated hydrocarbons, oxime compounds, hexaarylbiimidazole, organic peroxides, thio compounds, ketone compounds, aromatic anium salts, acridine compounds, phenylglycine compounds (e.g., N-phenylglycine), polyhalogenated compounds, coumarin compounds, amines, aminofluoran (e.g., ODB, ODBH), Crystal Violet Lactone (e.g., Leuco Crystal Violet), acylphosphine oxide, metallocenes, vicinal polyketaldonyl compounds, acyloin ether compounds, aromatic acyloin compounds substituted with α-hydrocarbons, polynuclear quinone compounds, organic boron compounds, radical generator, triarylsulfonium (e.g., (phenylthiophenyl)diphenylsulfonium) salts (e.g., salts with hexafluoroantimony or hexafluorophosphate), and phosphonium salts or onium salts effectively working as cationic polymerization initiator.

Triazine compounds having halogenated hydrocarbon groups, oxime compounds, hexaarylbiimidazole and ketone compounds are preferred in consideration of sensitivity, shelf life and adhesion (between the light-sensitive layer and the printed circuit substrate).

The triazine compounds having halogenated hydrocarbon groups are described in Wakabayashi, et. al., Bull. Chem. Soc. Japan, 42, 2924(1969), F. C. Schaefer et. al., J. Org. Chem. 29, 1527(1964), British Patent No. 1,388,492, German Patent No. 3,337,024, U.S. Pat. No. 4,239,850, Japanese Patent Provisional Publication Nos. 53(1978)-133428, 62(1987)-58241, 5(1993)-34920 and 5(1993)-281728.

The halogennated hydrocarbon group preferably is a halogenated aliphatic group, more preferably is a halogenated alkyl group, further preferably is a halogenated aliphatic group having 1 to 6 carbon atoms, and most preferably a halogenated methyl.

The halogen atom of the halogenated hydrocarbon group preferably is fluorine, chlorine or bromine, more preferably is chlorine or bromine, and most preferably is chlorine.

The triazine compound preferably has at least two halogenated hydrocarbon groups. A 1,3,5-triazine compound having at least two halogenated hydrocarbon groups is preferred. The most preferred compound is a 1,3,5-triazine compound in which all the 2-, 4- and 6 positions have substituent groups, at least two of which are halogenated hydrocarbon groups.

The particularly preferred compound is 2-substituted-4, 6-bis(trichloro)-1,3,5-triazine. Examples of the substituent groups at the 2-position include phenyl, 4-chlorophenyl, 2-tolyl, 4-methoxyphenyl, 2,4-dichlorophenyl, trichloromethyl, methyl, nonyl, (α,α,β-trichloroethyl, styryl, 4-methylstyryl, 4-methoxystyryl, 4-methoxynaphtho-1-yl, 4-ethoxynaphtho-1-yl, 4-(2-ethoxyethyl)-naphtho-1-yl, 4,7-dimethoxynaphtho-1-yl, acenaphtho-5-yl, 4-(4-methoxystyryl)phenyl, 1-naphthyl-vinylenephenyl, chlorostyrylphenyl, 4-thienyl-2-vinylphenyl, 4-thienyl-3-vinylphenyl, 4-furyl-2-vinylphenyl, 4-benzofuryl-2-vinylphenyl, 4-phenylethynylphenyl, 4-naphthyl-1-ethynylphenyl, 4-(4-tolylethynyl)phenyl, 4-(4-methoxyphenyl)ethynylphenyl, 4-(4-isopropylphenylethynyl)phenyl, 4-(4-ethylphenylethynyl)phenyl, 4-trifluoromethylphenyl, 2,6-difluorophenyl, 2,6-dichlorophenyl, 2,6-dibromophenyl, and 4-(N,N-diethoxycarbonylmethylamino)-3-bromophenyl.

Examples of other triazine compounds having halogenated hydrocarbon groups include 2-(4-methoxystyryl)-4-amino-6-trichloromethyl-1,3,5-triazine, 2-methyl-4,6-bis(tribromomethyl)-1,3,5-triazine, 2,4,6-tris(tribromomethyl)-1,3,5-triazine, 2,4,6-tris(dibromomethyl)-1,3,5-triazine, 2-amino-4-methyl-6-tri(bromomethyl)-1,3,5-triazine, 2,4,6-tris(trifluoromethyl)-1,3,5-triazine, and 2-(4-chlorophenyl)-4,6-bis(tribromomethyl)-1,3,5-triazine.

The oxadiazole compounds having halogenatuted hydrocarbon groups are described in U.S. Pat. No. 4,212,976.

Examples of the halogenated hydrocarbons are the same as those described about the halogenated hydrocarbon groups of the triazine compounds.

A preferred compound is a 1,3,4-oxadiazole compound having a halogenated hydrocarbon group. A more preferred compound is a 1,3,4-oxadiazole compound in which both 2- and 5 positions have substituent groups, at least one of which is a halogenated hydrocarbon group.

A particularly preferred compound is a 2-trichloromethyl-5-substituted-1,3,4-oxadiazole. Examples of the substituent groups at the 5-position include phenyl, 4-chlorophenyl, 1-naphthyl, 2-naphthyl, styryl, 4-chlorostyryl, 4-methoxystyryl and 4-butoxystyryl.

Examples of other oxadiazole compounds having halogenated hydrocarbon groups include 2-tribromomethyl-5-phenyl-1,3,4-oxadiazole, 2-tribromomethyl-5-(2-naphthyl)-1,3,4-oxadiazole, and 2-tribromomethyl-5-styryl-1,3,4-oxadiazole.

Examples of-the oxime compounds are shown in the following formulas.

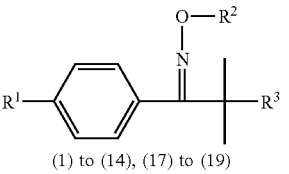

(1) to (14), (17) to (19)

| | $R^1$ | $R^2$ | $R^3$ |
|---|---|---|---|
| (1) | methoxy | allyl | dimethylamino |
| (2) | methylthio | allyl | morpholino |
| (3) | methyithio | benzyl | morpholino |

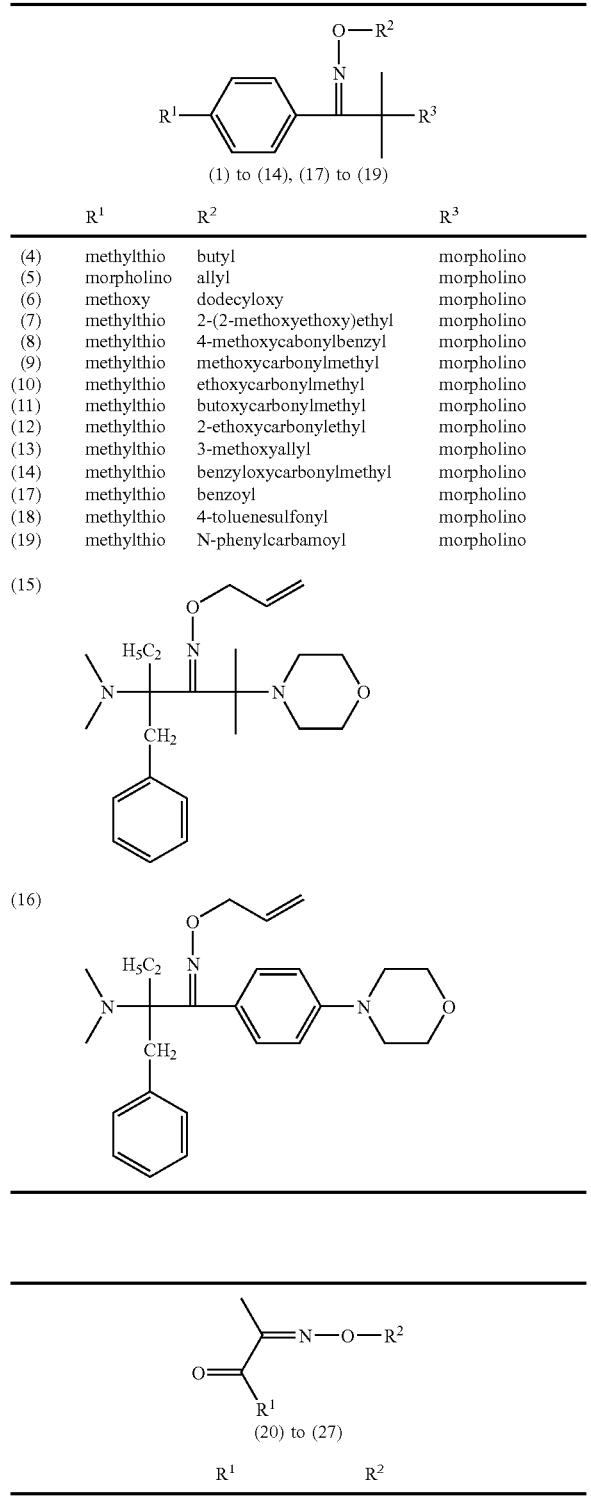
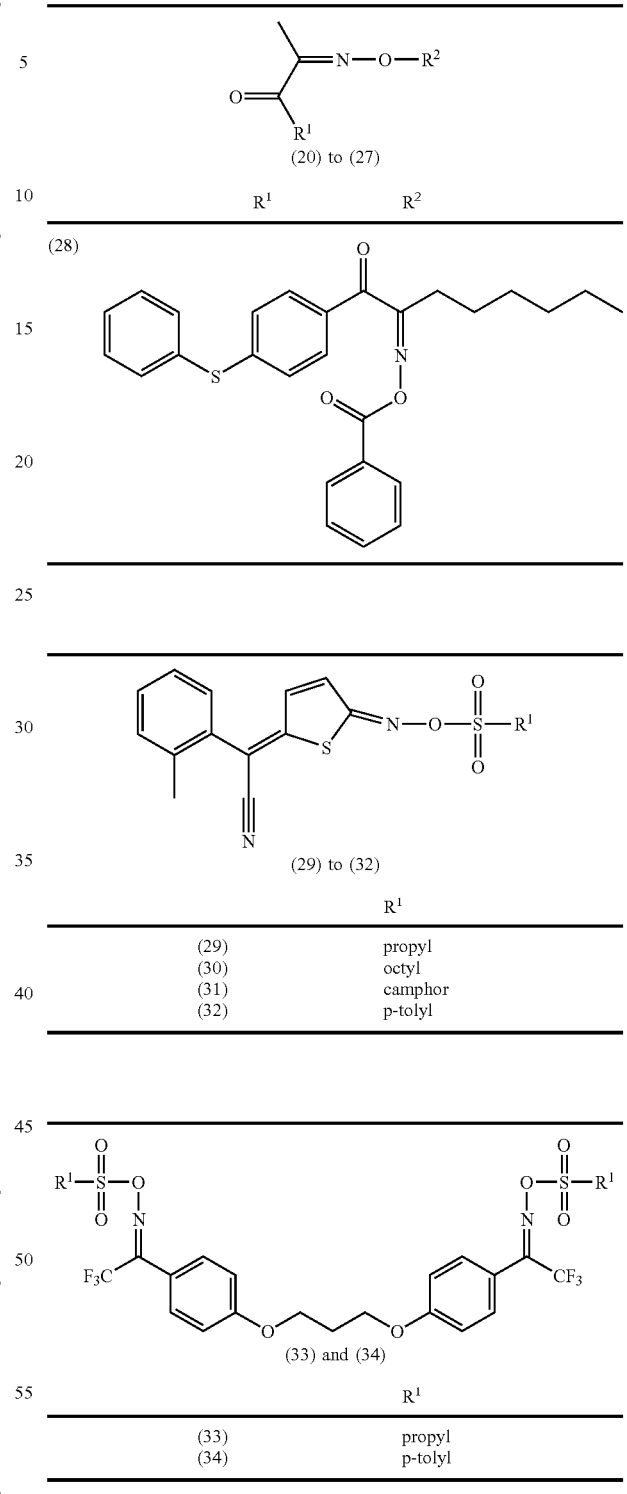
International Publication Pamphlet No. 00/52529 describes hexaarylbiimidazole. Hexaarylbiimidazole can be synthesized according to Bull. Chem. Soc. Japan, 33, 565 (1965) and J. Org. Chem., 36(16), 2262 (1971).
The hexaarylbiimidazole preferably is 2,2'-bis-substiututed-4,4',5,5'-tetraphenylbiimidazole. Examples of the substituent groups at the 2,2'-positions include 2-chlorophenyl, 2-fluorophenyl, 2-bromophenyl, 2,4-dichlorophenyl, 4-methoxyphenyl, 2-nitrophenyl, 2-methylphenyl and 2-trifluoromethylphenyl.

Examples of other hexaarylbiimidazoles include 2,2'-bis(2-chlorophenyl)-4,4',5,5'-tetra(3-methoxyphenyl) biimidazole and 2,2'-bis(2-chlorophenyl)-4,4',5,5'-tetra(4-methoxyphenyl) biimidazole.

Examples of the ketone compounds include benzophenone, a substituted benzophenone, 4-aminoacetophenone, benzyl(bibenzoyl), anthraquinone, 2-t-butylanthraquinone, 2-methylanthraquinone, phenanthraquinone, xanthone, thioxanthone, 2-chlorothioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]-propanol oligomer, benzoin, benzoin ether (e.g., benzoin methyl ether, benzoin ethyl ether, benzoin propyl ether, benzoin isopropyl ether, benzoin phenyl ether, benzoin dimethyl ketal), acridone, chloroacridone, N-methylacridone, N-butylacridone and N-butylchloroacridone.

Examples of the substituted benzophenones include 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxy-benzophenone, 2-ethoxycarbonylbenzophenone, benzophenone-tetracarboxylic acid, tetramethyl ester thereof, 4,4'-bis(dialkylamino)benzophenone (e.g., 4,4'-bis(dimethyl-amino)benzophenone, 4,4'-bis(dicyclohexylamino)benzophenone, 4,4'-bis(diethylamino)benzophenone, 4,4'-bis(dihydroxy-ethylamino)benzophenone), 4-methoxy-4'-dimethylaminobenzophenone, 4,4'-dimethoxybenzophenone, and 4-dimethylamino-benzophenone.

Examples of the acridine compounds include 9-phenylacridine, and 1,7-bis(9,9'-acridinyl)heptane.

Examples of the polyhalogenated compounds include carbon tetrabromide, phenyl tribromomethyl sulfone, and phenyl trichloromethyl ketone.

Examples of the coumarin compounds include 3-(2-benzofuroyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethyl-aminobenzoyl)-7-diethylaminocoumarin, 3,3'-carbonylbis(5,7-dipropoxycoumarin), 3,3'-carbonylbis(7-diethylamino-coumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)-coumarin, 3-benzoyl-5,7-dipropoxycoumarin, and 7-benzo-triazole-2-ylcoumarin. The coumarin compounds are described in Japanese Patent Provisional Publication Nos. 5(1993)-19475, 7(1995)-271028, 2002-363206, 2002-363207, 2002-363208 and 2002-363209.

Examples of the amines include ethyl 4-dimeylamonobenzoate, butyl 4-dimeylamonobenzoate, phenethyl 4-dimeylamonobenzoate, 2-phthalimidemethyl 4-dimeylamonobenzoate, 2-methacryloyloxyethyl 4-dimeylamonobenzoate, pentamethylene bis(4-dimethylaminobenzoate), phenethyl 3-dimeylamonobenzoate, pentamethylene 3-dimeylamonobenzoate, 4-dimethylaminobenzaldehyde, 2-chloro-4-dimethylamino-benzaldehyde, 4-dimethylaminobenzyl alcohol, ethyl(4-dimethylaminobenzoyl) acetate, 4-piperidinoacetophenone, 4-dimethylaminobenzoin, N,N-dimethyl-4-toluidine, N,N-diethyl-3-phenetidine, tribenzyl amine, dibenzylphenyl amine, N-methyl-N-phenylbenzyl amine, 4-bromo-N,N-dimethyl-aniline, and tridecyl amine.

Examples of the acylphosphine oxide include bis(2,4,6-trimethylbenzoyl)phenylphosphine oxide, bis(2,6-dimethoxy-benzoyl)-2,4,4-trimethylpentylphenylphosphine oxide, and Lucirin TPO.

Examples of the metallocenes include bis(η5-2,4-cyclopentadiene-1-yl)-bis(2,6-difluoro-3-(1H-pyrrole-1-yl)-phenyl)titanium, and η5-cyclopentadienyl-η6-cumenyl-iron(1+)-hexafluorophosphate(1−).

Other photo-polymerization initiators are described in Japanese Patent Publication Nos. 57(1982)-1819, 57(1982)-6096, Japanese Patent Provisional Publication Nos. 53(1978)-133428, 2002-229194, U.S. Pat. Nos. 2,367,660, 2,448,828, 2,722,512, 2,951,758, 3,046,127, 3,615,455 and International Publication Pamphlet No. 01/71428.

Two or more photo-polymerization initiators can be used in combination. Examples of the combinations include a set of hexaarylbiimidazole and 4-amino ketone (disclosed in U.S. Pat. No. 3,549,367), a set of benzothiazole compound and trihalomethyl-1,3,5-triazine compound (disclosed in Japanese Patent Publication No. 51(1976)-48516), a set of aromatic ketone compound (e.g., thioxanthone) and hydrogen donor (e.g., compound containing dialkylamino, phenol compound), a set of hexaaryl-biimidazole and titanocene, and a set of coumarin compound, titanocene and phenylglycine compound.

Each light-sensitive layer contains the photo-polymerization initiator preferably in an amount of 0.1 to 30 wt. %, more preferably in an amount of 0.5 to 20 wt. %, and most preferably in an amount of 0.5 to 15 wt. %.

The contents of photo-polymerization initiator in the light-sensitive layers can be controlled so that the light-sensitive layers have different sensitivities. For example, the second light-sensitive layer is made to contain much initiator than the first light-sensitive layer. The initiator content in the second light-sensitive layer is preferably 1.5 to 100 times, more preferably 1.8 to 50 times, most preferably 2 to 20 times as much as that in the first light-sensitive layer.

[Sensitizer]

Sensitizers can be incorporated into the light-sensitive layers to control the sensitivities or the wavelength range in which the layers are sensitive. In the case where the energy-ray (electromagnetic wave) active in exposure is a visible or ultraviolet ray or a visible laser beam, the sensitizer is excited by the active energy ray to interact with other substances (e.g., radical generator, acid generator) and to generate a radical or an acid.

Examples of the sensitizers include polynuclear aromatic compounds (e.g., pyrene, perylene, triphenylene), xanthene compounds (e.g. fluorescein, eosine, erythrosine, Rhodamine B, rose bengal), cyanine compounds (e.g., indocarbocyane, thiacarbocyane, oxycarbocyane), merocyanine compounds (e.g., merocyanine, carbomerocyanine), thiazine compounds (e.g., thionine, methylene blue, Toluidine Blue), acridine compounds (e.g., acridine orange, chloroflavin, acriflavin), anthraquinone compounds (e.g., anthraquinone), squarilium compounds (e.g., squarilium), acridone compounds (e.g., acridone, chloroacridone, N-methyacridone, N-butylacridone, N-butyl-chloroacridone), coumarin compounds (e.g., 3-(2-benzofuroyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylamino-coumarin, 3-(4-dimethylaminobenzoyl)-7-diethylaminocoumarin, 3,3'-carbonylbis(5,7-dipropoxycoumarin), 3,3'-carbonyl-bis(7-diethylaminocoumarin), 3-benzoyl-7-methoxycoumarin, 3-(2-furoyl)-7-diethylaminocoumarin, 3-(4-diethylamino-cinnamoyl)-7-diethylaminocoumarin, 7-methoxy-3-(3-pyridyl-carbonyl)coumarin, and 3-benzoyl-5,7-dipropoxycoumarin.

The coumarin compounds are described in Japanese Patent Provisional Publication Nos. 5(1993)-19475, 7(1995)-271028, 2002-363206, 2002-363207, 2002-363208 and 2002-363209.

A combination of photo-polymerization initiator and sensitizer is a system of electron transfer type (disclosed in Japanese Patent Provisional Publication No. 2001-305734). The system of electron transfer type can be categorized into (1) a set of a sensitizing dye and an initiator of electron donor type, (2) a set of a sensitizing dye and an initiator of electron acceptor type and (3) a set of a sensitizing dye and initiators of electron donor type and electron acceptor type (three-component system).

Each of the first light-sensitive layer and second light-sensitive layer can contain the sensitizer. The content of sensitizer in each layer is preferably in the range of 0.05 to 30 wt. %, more preferably in the range of 0.1 to 20 wt. %, and most preferably in the range of 0.2 to 10 wt. %.

The contents of sensitizer in the light-sensitive layers can be controlled so that the layers can have different sensitivities. For example, the second light-sensitive layer can contain much sensitizer than the first light-sensitive layer. The content of the sensitizer in the second light-sensitive layer preferably is 1.5 to 100 times, more preferably is 1.8 to 50 times, and most preferably is 2 to 20 times as much as the content of the sensitizer in the first light-sensitive layer. The sensitizer can be added not in the first light-sensitive layer but in the second light-sensitive layer.

[Polymerization Inhibitor]

Polymerization inhibitors can be added in the light-sensitive layers to prevent the polymerizable compound from polymerizing after preparing the light-sensitive sheet and before using the light-sensitive sheet.

Examples of the polymerization inhibitors include 4-methoxyphenol, hydroquinone, alkyl-substituted hydroquinone, aryl-substituted hydroquinone, t-butylcatechol, pyrogallol, 2-hydroxybenzophenone, 4-methoxy-2-hydroxybenzophenone, copper(I) chloride, phenothiazine, chloranil, naphthylamine, β-naphthol, 2,6-di-t-butyl-4-cresol, 2,2'-methylenebis(4-methyl-6-t-butylphenol), pyridine, nitrobenzene, dinitrobenzene, picric acid, 4-toluidine, methylene blue, a reaction product of copper and organic chelate agent, methyl salicylate, phenothiazine, nitroso compounds, and chelate of aluminum and nitroso compound.

Each of the first and second light-sensitive layers can contain the polymerization inhibitor. The content of inhibitor in each layer is preferably in the range of 0.001 to 5 wt. %, more preferably in the range of 0.005 to 2 wt. %, and most preferably in the range of 0.01 to 1 wt. %, based on the amount of the polymerizable compound.

[Plasticizer]

Plasticizers can be added to the light-sensitive layers to control physical characters (flexibility) of the light-sensitive layers.

Examples of the plasticizers include phthalates (e.g., dimethyl phthalate, dibutyl phthalate, diisobutyl phthalate, diheptyl phthalate, dioctyl phthalate, dicyclohexyl phthalate, ditridecyl phthalate, butylbenzyl phthalate, diisodecyl phthalate, diphenyl phthalate, diallyl phthalate, octylcapryl phthalate), esters of other aliphatic dibasic acids (e.g., diisobutyl adipate, dioctyl adipate, dimethyl sebacate, dibutyl sebacate, dioctyl sebacate, dioctyl azelate, dibutyl maleate, dioctyl 4,5-diepoxycyclohexane-1,2-dicarboxylate), esters of glycol (e.g., triethylene glycol diacetate, tetraethylene glycol diacetate, dimethyl glycol phthalate, triethylene glycol dicaprate), glycolic esters (e.g., ethylphthalyl ethyl glycolate, methylphthalyl butyl glycolate), phosphoric esters (e.g., tricresyl phosphate, triphenyl phosphate), amides (e.g., 4-toluenesulfonaminde, benzenesulfonamide, N-butylbenzenesulfonamide, N-butylacetamide), other esters of aliphatic dibasic acids (e.g., glycerol triacetate, butyl laurate), esters of aliphatic tribasic acids (e.g., triethyl citrate, tributyl citrate), and glycols (e.g., polyethylene glycol, polypropylene glycol).

Each of the first and second light-sensitive layers can contain the plasticizer. The content of plasticizer in each layer is preferably in the range of 0.1 to 50 wt. %, more preferably in the range of 0.5 to 40 wt. %, and most preferably in the range of 1 to 30 wt. %, based on the total weight of the layer.

[Color Former]

Color formers (as printing-out agent) can be added to the light-sensitive layers to form a visible image after exposing the light-sensitive layers to light.

Examples of the color formers include aminotriarylmethane compounds, aminoxanthine compounds, aminothioxanthene compounds, amino-9,10-dihydroacridine compounds, aminophenoxazine compounds, aminophenothiazine compounds, aminodihydrophenazine compounds, aminophenylmethane compounds, diphenylamine compounds, aminohydrocinnamates, hydrazine compounds, amino-2,3-dihydroanthraquinone compounds, phenethylaniline compounds, acyl-substituted and amino-substituted leuco dyes, leuco compounds not having oxidizable hydrogens but being oxidizable into color former compounds, leucoindigoid dyes, and organic amines oxidizable into coupler forms. Particularly preferred are triarylmethane compounds (e.g., Leuco Crystal Violet).

Examples of the aminotriarylmethane compounds include tris(4-dimetylaminophenyl)methane (Leuco Crystal Violet), tris(4-dietylaminophenyl)methane, tris(4dimetylamino-2-methylphenyl)methane, tris(4-dietylamino-2-methylphenyl) methane, tris(4-dibutylaminophenyl)-[4-(2-cyanoethyl)methylaminophenyl]methane, bis(4-dimethylaminophenyl)-2-quinolylmethane, and tris(4-dibromoaminophenyl)methane.

Examples of the aminoxanthine compounds include 3,6-bis(dimethylamino)-9-phenylxanthine, and 3-amino-6-dimethylamino-2-methylamino-2-methyl-9-(2-chlorophenyl) xanthine.

Examples of the aminothioxanthene compounds include 3,6-bis(diethylamino)-9-(2-ethoxycarbonylphenyl)thio-xanthene, and 3,6-bis(dimethylamino)thioxanthene.

Examples of the amino-9,10-dihydroacridine compounds include 3,6-bis(diethylamino)-9,10-dihydro-9-phenylacridine, and 3,6-bis(benzylamino)-9,10-dihydro-9-methylacridine.

Examples of the aminophenoxazine compounds include 3,7-bis(diethylamino)phenoxazine.

Examples of the aminophenothiazine compounds include 3,7-bis(diethylamino)phenothiazine.

Examples of the aminodihydrophenazine compounds include 3,7-bis(diethylamino)-5-hexyl-5,10-dihydrophenazine.

Examples of the aminophenylmethane compounds include bis(4-dimethylaminophenyl)anilinomethane.

Examples of the diphenylamine compounds include 4-amino-4'-dimethyldiphenylamine.

Examples of the aminohydrocinnamates include methyl 4-amono-α,β-dicyanohydrocinnamate.

Examples of the hydrazine compounds include 1-(2-naphthyl)-2-phenylhydrazine.

Examples of the amino-2,3-dihydroanthraquinone compounds include 1,4-bis(ethylamino)-2,3-dihydroanthraquinone.

Examples of the phenethylaniline compounds include N,N-diethyl-4-phenethylaniline.

Examples of the acyl-substituted and amino-substituted leuco dyes include 10-acetyl-3,7-bis(dimethylamino)phenothiazine.

Examples of the leuco compounds, which do not have oxidizable hydrogens but can be oxidized into color former include tris(4-diethylamino-2-tolyl)ethoxycarbonylmethane.

Examples of the organic amines, which can be oxidized into color formers include ethylenediamine, di-phenylamine, N,N-dimethylaniline, methylenediamine, triphenylamine and N-vinylcarbazole, which are described in U.S. Pat. Nos. 3,042,515 and 3,042,517.

The color former in the form of a leuco comound can be used in combination with a halogenated organic compound to develop color.

Examples of the halogenated organic compounds include halogenated hydrocarbons, halogenated alcohols, halogenated ketones, halogenated ethers, halogenated esters, halogenated amides, halogenated sulfones, halogenated phosphates, and halogenated heterocyclic compounds. In the halogen compound, two or more halogen atoms are preferably bound to one carbon atom. It is more preferred that three or more halogen atoms be bound to one carbon atom.

Examples of the halogenated hydrocarbons include carbon tetrabromide, iodoform, ethylene bromide, methylene bromide, amyl bromide, isoamyl bromide, amyl iodide, isobutylene bromide, butyl iodide, diphenylmethyl bromide, hexachloroethane, 1,2-dibromoethane, 1,1,2,2-tetrabromoethane, 1,2-dibromo-1,1,2-trichloroethane, 1,2,3-tribromopropane, 1-bromo-4-chlorobutane, 1,2,3,4-tetrabromobutane, tetrachlorocyclopropane, hexachlorocyclopentane, dibromocyclohexane, and 1,1,1-trichloro-2,2-bis(4-chlorophenyl)ethane.

Examples of the halogenated alcohols include 2,2,2-trichloroethanol, tribromoethanol, 1,3-dichloro-2-propanol, 1,1,1-trichloro-2-propanol, di(iodohenxamethylene)aminoisopropanol, tribromo-t-butyl alcohol, and 2,2,3-trichlorobutane-1,4-diol.

Examples of the halogenated ketones include 1,1-dichloroacetone, 1,3-dichloroacetone, hexachloroacetone, hexabromoacetone, 1,1,3,3-tetrachloroacetone, 1,1,1-trichloroacetone, 3,4-dibromo-2-butanone, 1,4-dichloro-2-butanone, and dibromocyclohexanone.

Examples of the halogenated ethers include 2-bromoethyl methyl ether, 2-bromoethyl ethyl ether, di(2-bromoethyl) ether, and 1,2-dichloroethyl ethyl ether.

Examples of the halogenated esters include bromoethyl acetate, ethyl trichloroacetate, trichloroethyl trichloroacetate, homopolymer or copolymer of 2,3-dibromopropyl acrylate, trichloroethyl dibromopropionate, and ethyl α,β-dichloroacrylate.

Examples of the halogenated amides include chloroacetamide, bromoacetamide, dichloroacetamide, trichloroacetamide, tribromoacetamide, trichloroethyltrichloro-acetamide, 2-bromoisopropionamide, 2,2,2-trichloropropionamide, N-chlorosuccinimide, and N-bromosuccinimide.

Examples of the halogenated sulfones include tri-bromomethyl phenyl sulfone, 4-nitrophenyl tribromomethyl sulfone, and 4-chlorophenyl tribromomethyl sulfone.

Examples of the halogenated phosphates include tris(2,3-dibromopropyl) phosphate.

Examples of the halogenated heterocyclic compound include 2,4-bis(trichloromethyl)-6-phenyltriazole.

Particularly preferred halogen compounds are tri-bromomethyl phenyl sulfone and 2,4-bis(trichloromethyl)-6-phenyltriazole.

Two or more halogenated organic compounds can be used in combination.

Each of the first and second light-sensitive layers can contain the color former. The content of the color former in each layer is preferably in the range of 0.01 to 20 wt. %, more preferably in the range of 0.05 to 10 wt. %, and most preferably in the range of 0.1 to 5 wt. %, based on the total weight of the layer.

Each of the first and second light-sensitive layers can contain the halogenated organic compound. The content of halogenated organic compound in each layer is preferably in the range of 0.001 to 5 wt. %, more preferably in the range of 0.005 to 1 wt. %, based on the total weight of the layer.

[Dye]

Dyes can be added in the light-sensitive layers to shield the layers from light in a particular wavelength range. The dyes can improve the light-sensitive layers in handling and stability while storing the light-sensitive sheet.

Examples of the dyes include Brilliant Green (e.g., sulfate salt thereof), Eosine, Ethyl Violet, Erythrocin B, Methyl Green, Crystal Violet, Basic fuchsin, Phenolphthalein, 1,3-diphenyltriazine, Alizarin Red S, Thymolphthalein, Methyl Violet 2B, Quinaldine Red, Rose Bengal, Matanyl Yellow, thymolsulfophthalein, Xylenol Blue, Methyl Orange, Orange IV, diphenylthiocarbazone, 2,7-dichlorofluorescein, Paramethyl Red, Congo Red, benzopurpurin 4B, α-Naphthyl Red, Nile Blue A, phenacetaline, Methyl Violet, Malachite Green, parafuchsine, Oil Blue #603 (Orient Chemical Industries Co., ltd), Rhodamine B, Rhodamine 6G, and Victoria Pure Blue BOH. Cationic dyes are preferred.

Cationic dyes can have counter anions, which are preferably residues of organic or inorganic acids. Examples of the acids include bromic acid, iodic acid, sulfuric acid, phosphoric acid, oxalic acid, methanesulfonic acid, and toluenesulfonic acid. Oxalate salts of Malachite Green and sulfate salts of Malachite Green are particularly preferred.

Each of the first and second light-sensitive layers can contain the dye. The content of the dye in each layer is preferably in the range of 0.001 to 10 wt. %, more preferably in the range of 0.01 to 5 wt. %, most preferably in the range of 0.1 to 2 wt. %, based on the total weight of the layer.

[Adhesion Promoter]

Adhesion promoters can be added to the layers to improve adhesion between the layers or between the substrate and the light-sensitive sheet.

Adhesion promoters are described in Japanese Patent Provisional Publication Nos. 5(1993)-11439, 5(1993)-341532 and 6(1994)-43638.

Examples of the adhesion promoters include benzimidazole, benzoxizole, benzthiazole, 2-mercaptobenzimidazole, 2-mercaptobenzoxazole, 2-mercaptobenzthiazole, 3-morpholinomethyl-1-phenyltriazole-2-thione, 5-amino-3-morpholinomethylthiadiazole-2-thione, 2-mercapto-5-methylthiothiadiazole, triazole, tetrazole, benzotriazole, carboxybenzotriazole, and benzotriazole having amino group. Silane coupling agents can also be used as the adhesion promoters.

Each of the first and second light-sensitive layers can contain the adhesion promoter. The content of adhesion promoter in each layer is preferably in the range of 0.001 to 20 wt. %, more preferably in the range of 0.01 to 10 wt. %, and most preferably in the range of 0.1 to 5 wt. %, based on the total weight of the layer.

[Surface Active Agent]

Surface active agent can be incorporated into the light-sensitive layers to reduce unevenness on the surface of the light-sensitive sheet. The unevenness is often caused in preparation of the light-sensitive sheet.

The surface active agents include an anionic surface active agent, a cationic surface active agent, a nonionic surface active agent, an amphoteric surface active agent and a fluorine-containing surface active agent. A fluorine-containing high-molecular surface active agent can be also preferably used as the surface active agent. An example of the fluorine-containing high-molecular surface active agent is a polymer obtained by polymerizing an (meth)acrylic ester having fluorinated aliphatic group, which contains fluorine atoms in an amount of 40 wt. % or more, and 3 to 20 carbon atoms. In the fluorinated aliphatic group, hydrogen atoms attached to first, second and third carbon atoms numbered from the free terminal are preferably replaced with fluorine atoms.

Each of the first and second light-sensitive layers can contain the surface active agent. The content of surface active agent in each layer is preferably in the range of 0.001 to 10 wt. %, based on the solid content of coating solution for forming the layer.

[Other Components]

The light-sensitive layers can contain other optional components (e.g., pigment, electro-conductive particles, filler, anti-foaming agent, fire retardant, leveling agent, releasing accelerator, oxidation inhibitor, flavor, thermal cross-linking agent, surface tension controller, chain transferring agent).

Each of the first and second light-sensitive layers can contain the auxiliary components.

The optional components in the light-sensitive layers are described in, for example, J. Coser, "Light Sensitive Systems", Chapter 5.

The light-sensitive layers can contain organic sulfur compounds, peroxides, redox compounds, azo compounds, diazo compounds, light-reductive dyes or organic halogen compounds.

Examples of the organic sulfur compounds include dibutyl disulfide, dibenzyl disulfide, 2-mercaptobenzthiazole, 2-mercaptooxazole, thiophenol, ethyltrichloromethanesulfenate and 2-mercaptobenzimidazole.

Examples of the peroxides include di-t-butyl peroxide, benzoyl peroxide and methyl ethyl ketone peroxide.

The redox compounds are combinations of peroxides and reducing agents. Examples of the combinations include a set of iron(II) ion and perfulfate ion and a set of iron(III) ion and peroxide ion.

Examples of the azo and diazo compounds include diazonium compounds (e.g., $\alpha,\alpha'$-azobisbutyronitrile, 2-azobis-2-methylbutyronitrile, 4-aminodiphenylamine).

Examples of the light-reductive dyes include rose bengal, erythrosine, eosine, acriflavine, riboflavine, and thionine.

[Preparation of Light-sensitive Sheet]

In preparation of the light-sensitive sheet, the components of the light-sensitive layers are dissolved, emulsified or dispersed in a solvent (water or organic solvent) to prepare a coating solution (solution of light-sensitive resin composition) for forming each of the first and second light-sensitive layers.

Examples of the organic solvents include alcohols (e.g., methanol, ethanol, propanol, isopropanol, butanol, sec-butanol, hexanol), ketones (e.g., acetone, methyl ethyl ketone, methyl isobutyl ketone, cyclohexanone, disiobutyl ketone), esters (e.g., ethyl acetate, butyl acetate, amyl acetate, methyl sulfate, ethyl propionate, dimethyl phthalate, ethyl benzoate, methoxypropyl acetate), aromatic hydrocarbons (e.g., toluene, xylene, benzene, ethylbenzene), halogenated hydrocarbons (e.g., carbon tetrachloride, trichloroethylene, chloroform, 1,1,1-trichloroethane, methylene chloride, monochlorobenzene), ethers (e.g., tetrahydrofuran, diethyl ether, ethylene glycol monomethyl ether, ethylene glycol monoethyl ether, 1-methoxy-2-propanol), amides (e.g., dimethylformamide, dimethylacetamide), sulfoxides (e.g., dimethyl sulfoxide) and sulfolane.

Two or more solvents can be used in combination.

The surface active agent can be added to the coating solution.

The coating solution for first light-sensitive layer is coated on the support, and then dried to form the first light-sensitive layer. The coating solution for second light-sensitive layer is coated on the first light-sensitive layer, and then dried to form the second light-sensitive layer. The coating solutions for the first and second light-sensitive layers can be coated simultaneously on the support. Examples of the coating method include spray method, roll-coating method, spin-coating method, slit coating method, extrusion coating method, curtain coating method, die coating method, gravure coating method, wire-bar coating method and knife coating method.

The coated solutions are dried preferably at 60 to 110° C. The drying time is preferably in the range of 30 seconds to 15 minutes.

The above procedures can be repeated three times for more to form three or more light-sensitive layers.

The total thickness of the light-sensitive layers can be arranged in the range of 10 μm to 1 mm, where three or more light-sensitive layers are formed.

[Support and Protective Film]

The support preferably has a surface from which the light-sensitive layers can be peeled. The support is preferably highly transparent, and preferably has a smooth surface.

The support is preferably a polymer film. Example of the polymer include polyethylene terephthalate, polyethylene naphthalate, polyethylene, cellulose polymers (e.g., cellulose triacetate, cellulose diacetate), alkyl esters of poly (meth)acrylic acid, polyvinyl chloride, polyvinyl acetate, polyvinyl alcohol, polycarbonate, polystyrene, cellophane, polyamide, polyimide, polytetra-fluoroethylene and polytrifluoroethylene. Copolymers of the above (e.g., vinyl-chloride-vinyl acetate copolymer) are also usable. Two or more polymers can be used in combination.

Particularly preferred is polyethylene terephthalate.

The thickness of the support is preferably in the range of 2 to 150 μm, more preferably in the range of 5 to 100 μm, and most preferably in the range of 8 to 50 μm.

The light-sensitive sheet is preferably in the shape of a long film. The support is preferably in the shape of a long film. The length of the film is preferably 10 to 20,000 m.

A protective film can be provided on the second light-sensitive layer in the light-sensitive sheet.

The protective film can be the polymer films described about the support. The protective film can be paper or paper laminated with a polymer film (e.g., polyethylene film or polypropylene film) in addition to the polymer films. A polyethylene film or a polypropylene film is preferred.

The protective film has a thickness preferably in the range of 5 to 100 µm, more preferably in the range of 8 to 50 µm, and most preferably in the range of 10 to 30 µm.

It is necessary to control adhesion forces Su and Pr between the support and the first light-sensitive layer and between the protective film and the second light-sensitive layer, respectively to satisfy the condition of Su>Pr.

Examples of the combinations of the support/protective film include polyethylene terephthalate film/polypropylene film, polyethylene terephthalate film/polyethylene film, polyvinyl chloride film/cellophane film, polyimide film/polypropylene film, and polyethylene terephthalate film/polyethylene terephthalate film.

The support or the protective film can be subjected to surface treatment to control the adhesion forces as is mentioned above. For example, the support is subjected to surface treatment to enhance the adhesion onto the light-sensitive layer. Examples of the surface treatment include corona discharge treatment, flame treatment, ultraviolet (UV) treatment, high-frequency treatment, glow discharge treatment, active plasma treatment and laser treatment. An undercoating layer can be provided on the support as a surface treatment.

In the case that light-sensitive sheets are piled up in storage, the protective film (top) of one sheet is in contact with the support (bottom) of another sheet placed thereon. In that case, static friction between the support and the protective film is important. The coefficient of static friction between the support and the protective film is preferably in the range of 0.3 to 1.4, and more preferably in the range of 0.5 to 1.2.

A light-sensitive sheet in the shape of a long film is preferably wound up around a cylindrical core into a roll while storing the light-sensitive sheet. The light-sensitive sheet in the shape of a long film can be slit, and then wound up into some rolls in the range of 100 to 1,000 m to improve handling for users. The sheet is preferably wound up to arrange the support outside.

The rolled light-sensitive sheet can be slit as a rectangular shape.

The sectioned surfaces are preferably covered with separators (which are moisture-proof or contain desiccating agents) to protect the edge of the light-sensitive sheet (from edge fusion). The moisture-proof packaging materials are also preferably used in packaging the light-sensitive sheet.

The protective film can be subjected to the surface treatment to enhance the adhesion onto the light-sensitive layer. For example, the protective film can be coated with an undercoating layer made of polymer (e.g., polyoliganosiloxane, fluorinated polyolefin, polyfluoroethylene, polyvinyl alcohol). A coating solution containing the polymer is coated, and dried on the protective film to form the undercoating layer. The coating solution is dried at a temperature preferably of 30 to 150° C., more preferably of 50 to 120° C. The drying time is preferably in the range of 1 to 30 minutes.

[Other Layers]

The light-sensitive sheet can comprise other optional layers (e.g., cushion layer, releasing layer, adhesive layer, light-absorbing layer, surface-protective layer).

[Substrate]

The light-sensitive sheet is transferred to a substrate. The substrate can be a known substrate conventionally used for producing a printed circuit board (e.g., copper-clad laminate). A glass plate (e.g., plate of soda-glass), a film of synthesis resin and a sheet of paper or metal can also be used as the substrate. The substrate can have a smooth or rough surface, which is determined according to the use of the substrate.

On the substrate, the second light-sensitive layer and the first light-sensitive layer are laminated in this order to prepare a light-sensitive laminate. The second light-sensitive layer contains the binder, the polymerizable compound and the photo-polymerization initiator. The first light-sensitive layer also contains the binder, the polymerizable compound and the photo-polymerization initiator. The light-sensitivity of the first light-sensitive layer is lower than the sensitivity of the second light-sensitive layer.

In more detail, the light-sensitive sheet is laminated on the substrate to prepare the light-sensitive laminate. The support of the light-sensitive sheet can be peeled from the light-sensitive laminate.

The light-sensitive sheet can be used as an image-forming or pattern-forming material to prepare a printed circuit board, an element of displaying device (e.g., color filter, rib, spacer, partition), a hologram, a micromachine or a proof. The light-sensitive sheet is preferably used for preparation of a printed circuit board or an element of displaying device. The light-sensitive sheet is more preferably used to prepare a printed circuit board.

The substrate preferably is a substrate for preparation of a printed circuit board.

[Pattern-forming Process]

A desired pattern can be formed from the light-sensitive sheet by the steps of:

(1) placing the light-sensitive sheet on the substrate while arranging the second light-sensitive layer of the light-sensitive sheet on the substrate to prepare a light-sensitive laminate, (2) exposing the light-sensitive laminate to light incident upon the first light-sensitive layer-side, according to the image pattern, to harden both of the first and second light-sensitive layers in the exposed area, (3) removing the support from the light-sensitive laminate, and (4) developing the light-sensitive laminate to remove the layers in the unhardened area.

The formed pattern is a relief consisting of areas where both of the first and second light-sensitive layers are hardened and where the layers are removed.

The desired pattern can be also formed from the light-sensitive sheet by the steps of:

(1) placing the light-sensitive sheet on the substrate while arranging the second light-sensitive layer of the light-sensitive sheet on the substrate-side to prepare a light-sensitive laminate, (2) exposing the light-sensitive laminate to light which is incident upon the first light-sensitive layer-side and which has at least two different exposure-energy levels in accordance with the image pattern, to harden both of the first and second light-sensitive layers in the area where the light having the relatively high energy level is applied and to harden only the second light-sensitive layer in the area where the light having the relatively low energy level is applied, (3) removing the support from the light-sensitive laminate, and (4) developing the light-sensitive laminate to remove the layers in the unhardened area.

The formed pattern is a relief consisting of the areas where the first and second light-sensitive layers are hardened, where only the second light-sensitive layer is hardened, and where the surface of the substrate is bared.

In the above procedures, the step (3), in which the support is peeled from the light-sensitive laminate, is performed between the steps (1) and (2) instead of between the steps (2) and (4).

The light exposure of the step uses a light source that emits electromagnetic wave, which activates the photo-polymerization initiator or the sensitizer. In the case where the light-sensitive laminate is exposed to light through the support, the light must be in such wavelength range that it can pass through the support. The wavelength is preferably in the range of 300 to 1,500 nm, more preferably in the range of 320 to 800 nm (ultra-violet to visible region), and most preferably in the range of 330 to 650 nm. Examples of the light source include a (ultra)high pressure mercury lamp, a xenon lamp, a carbon-arc lamp, a halogen lamp, a fluorescent lamp, a LED and a semiconductor laser. An electron beam and X-ray can be also used.

In the light-exposure step, a laser beam is preferably used to scan the first light-sensitive layer-side surface of the light-sensitive laminate. The laser beam is in the wavelength region of preferably 200 to 1,500 nm, more preferably 300 to 800 nm, further preferably 370 to 650 nm, and most preferably 400 to 450 nm.

[Process for Producing a Printed Circuit Board]

The light-sensitive sheet can be used to prepare a printed circuit board, especially a printed circuit board having holes such as a through-hole and a via-hole.

A desired circuit (wiring) pattern can be formed on a substrate of printed circuit board from the light-sensitive sheet by the steps of:

(1) placing the light-sensitive sheet on the substrate while arranging the second light-sensitive layer of the light-sensitive sheet on the substrate-side to prepare a light-sensitive laminate, (2) exposing the light-sensitive sheet to light incident upon the first light-sensitive layer-side, according to the image pattern, to harden both of the first and second light-sensitive layers in the exposed area, (3) removing the support from the light-sensitive laminate, and (4) developing the light-sensitive laminate to remove the layers in the unhardened area.

The formed pattern consists of areas where both of the first and second light-sensitive layers are hardened to cover the substrate and where the layers are removed to bare the surface of the substrate.

The desired pattern can be also formed on the substrate of printed circuit board from the light-sensitive sheet by the steps of:

(1) placing the light-sensitive sheet on the substrate while arranging the second light-sensitive layer of the light-sensitive sheet on the substrate-side to prepare a light-sensitive laminate, (2) exposing the light-sensitive laminate to light which is incident upon the first light-sensitive layer-side and which has at least two different exposure-energy levels, in the manner that the light having the relatively high energy level is applied onto the holes and neighborhoods thereof to harden both of the first and second light-sensitive layers and that the light having the relatively low energy level is applied onto areas where wiring of the desired circuit pattern is to be formed to harden only the second light-sensitive layer, (3) removing the support from the light-sensitive laminate, and (4) developing the light-sensitive laminate to remove the layers in the unhardened area.

The formed circuit pattern consists of areas where the first and second light-sensitive layers are hardened to cover the holes, where only the second light-sensitive layer is hardened to cover the surface of the support and where the substrate surface is bared.

The term "neighborhoods" of the holes means areas needed for fixing a hardened resin film (tenting film) covering the holes on the substrate. The area referred to as a land (or pad).

In the procedures, the step (3), in which the support is peeled from the light-sensitive laminate, is performed between the steps (1) and (2) instead of between the steps (2) and (4).

In the case that the light-sensitive laminate is exposed to light through the support at the step (2), a light source gives off light passing through the support. The light activates the photo-polymerization initiator or the sensitizer. The light source preferably is a laser.

After the above procedure, the substrate on which the circuit pattern is formed is subjected to plating or etching treatment to prepare a printed circuit board. The plating or etching treatment is, for example, performed according to a known subtractive method or to a known additive method (semi-additive method, full-additive method). The substrate is preferably subjected to etching treatment of the subtractive method. The hardened resin residue remaining on the thus-treated substrate can be peeled, and then, if the semi-additive method is adopted, copper in the bared area can be etched to produce a desired printed circuit board. Even a multi-layered printed circuit board can be also produced in the same manner as descried above.

Figure 7:
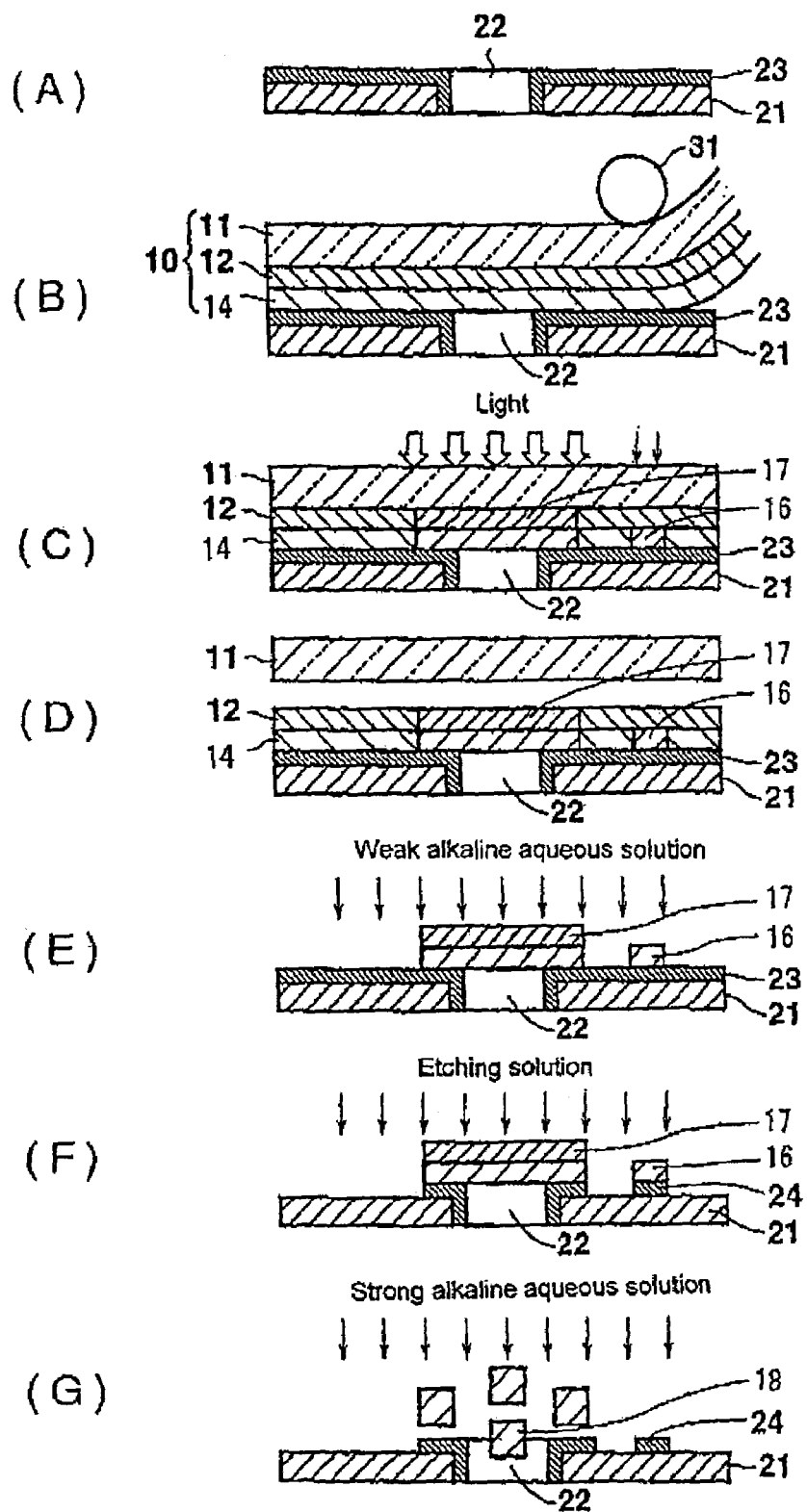
FIG. 7 schematically illustrates steps for preparation of a printed circuit board according to the invention.

A process of preparation of a printed circuit board having a through-hole from the light-sensitive sheet is explained in detail referring to FIG. 7. FIG. 7 schematically illustrates a process by which the printed circuit board is produced from the light-sensitive sheet shown in FIG. 1 or 2.

First, as shown in FIG. 7(A), a substrate 21 for producing a printed circuit board is used. The substrate 21 has a through-hole 22 and a surface covered with a metal plating layer 23. The substrate 21 can be a copper clad laminate, an insulating base (e.g., glass-epoxy base) having a copper-plating layer provided thereon, or a copper-plating layer-provided laminated substrate in which bases and insulating films are alternatively layered.

Second, as shown in FIG. 7(B), a light-sensitive sheet 10 is placed on the substrate 21 so that the second light-sensitive layer 14 can be in contact with the substrate 21. If the light-sensitive sheet has a protective film, the light-sensitive sheet 10 is placed on the substrate 21 after the protect film is peeled and removed from the light-sensitive sheet. The light-sensitive sheet and the substrate are then pressed to laminate by means of a pressing roller 31 (laminating step). Thus, a light-sensitive laminate comprising the substrate 21, the second light-sensitive layer 14, the first light-sensitive layer 12 and the support 11 in this order is produced. The laminating step can be carried out at room temperature (15 to 30° C.) or at an elevated temperature (30 to 180° C.). The temperature is preferably in the range of 60 to 140° C. The pressure applied to the light-sensitive laminate of the light-sensitive sheet and the substrate is preferably in the range of 1 to 10 kg/cm². The light-sensitive laminate is preferably transferred under the roller 31 at a speed of preferably 1 to 3 m/minute. The substrate 21 can be preheated. The laminating step can be carried out under a reduced pressure.

The light-sensitive laminate can be directly prepared without using the light-sensitive sheet. The light-sensitive laminate comprising a substrate, a second light-sensitive layer and a first light-sensitive layer in this order can prepared by coating the coating solution for forming the second light-sensitive layer of the light-sensitive sheet and the coating solution for forming the first-light sensitive layer on the substrate in this order, and drying the light-sensitive layers.

Third, as shown in FIG. 7(C), light is applied onto the light-sensitive laminate from the support 11-side, to harden the light-sensitive layers. In this step, if needed (for example, in the case where the support is insufficiently transparent), the light-sensitive laminate can be irradiated with the light after the support is peeled off. The areas where wiring of the circuit pattern is to be formed on the substrate 21 are exposed to the light having energy needed to harden only the second light-sensitive layer 14 according to a predetermined pattern, to form a hardened layer 16 for circuit pattern (exposure step for circuit pattern). On the other hand, the area where a mouth of through-hole 22 and neighborhood thereof is located is exposed to the light having enough energy to harden both first and second light-sensitive layers 12 and 14, to form a hardened layer 17 for protecting the metal layer in the through-hole (exposure step for hole-area). The exposure steps for circuit pattern and for hole-area can be independently performed, but are preferably carried out at the same time. The exposure can be carried out by applying light through a photo-mask or by applying a laser beam in a laser-exposing apparatus. The latter is suitable for producing various products in small lots because an expensive photo-mask is unnecessary and troubles caused by the mask can be avoided.

In the case where the light is applied through a photo-mask, the exposure can be carried out twice. First, the light having energy needed to harden only the second light-sensitive layer 14 is applied through a photo-mask for forming the hardened layer 16 (for circuit pattern). After that, the light having enough energy to harden both first and second light-sensitive layers 12 and 14 is applied through another photo-mask for forming the hardened layer 17 (for protecting the metal layer in the through-hole). It is also possible to perform the exposure only once. In that case, a photo-mask in which the area corresponding to the hardened layer 16 (for circuit pattern) is made less transparent than that corresponding to the hardened layer 17 (for protecting the metal layer in the through-hole) is used. In the case where a laser beam is used in a laser-exposing apparatus, the exposure amount of laser beam is preferably controlled according to the areas.

Fourth, as shown in FIG. 7(D), the support 11 is peeled from the light-sensitive laminate if it still remains (support-peeling step).

Fifth, as shown in FIG. 7(E), the first and second light-sensitive layers in the unhardened area on the substrate 21 are dissolved and removed in an appropriate developing solution, to form a pattern consisting of the hardened layer 16 (for circuit pattern) and the hardened layer 17 (for protecting the metal layer in the through-hole) and to bare the metal plating layer 23 in the unhardened area on the surface of the substrate.

Examples of the developing solution include alkaline aqueous solutions, aqueous developers and organic solvents.

A weak alkaline aqueous solution is preferred. Examples of the basic component of the weak alkaline aqueous solution include lithium hydroxide, sodium hydroxide, potassium hydroxide, lithium carbonate, sodium carbonate, potassium carbonate, lithium hydrogencarbonate, sodium hydrogencarbonate, potassium hydrogencarbonate, sodium phosphate, potassium phosphate, sodium pyrophosphate, potassium pyrophosphate and borax. The pH value of the weak alkaline aqueous solution is preferably in the range of 8 to 12, more preferably in the range of 9 to 11. A concrete example of the developing solution is 0.1 to 5 wt. % aqueous solution of sodium or potassium carbonate. The temperature of the developing solution is preferably in the range of 25 to 40° C.

The developing solution can contain surface active agents, anti-foaming agents, organic bases (e.g., ethylenediamine, ethanolamine, tetramethylammonium hydroxide, diethylenetriamine, triethylenepentamine, morpholine, triethanolamine), and organic solvents accelerating development (e.g., alcohols, ketones, esters, ethers, amides, lactones). The developing solution can be an aqueous developer prepared by mixing organic solvent and water or alkaline aqueous solution, or can be an organic solvent alone.

After the development, after-treatments such as after-heating and after-exposure can be carried out to accelerate the hardening reaction in the hardened areas. Instead of the above-described wet developing process, a dry developing process can be adopted.

Sixth, as shown in FIG. 7(F), the metal plating layer 23 in the bared area is dissolved and removed in an etching solution (etching step). Since the mouth of through-hole 22 is covered with a hardened resin composition (tenting film) 17, the etching solution is prevented from flowing into the through-hole and from corroding the metal plating layer in the through-hole. Accordingly, the metal plating layer in the through-hole can remain in a desired pattern during the etching step. In this way, a circuit pattern 24 is formed on the substrate 21. In the case where the metal plating layer is made of copper, the etching solution can be copper(III) chloride solution, iron (III) chloride solution, alkaline etching solution or hydrogen peroxide etching solution. In consideration of etching factor, iron (III) chloride solution is preferred.

Finally, as shown in FIG. 7(G), the hardened layers 16, 17 remaining as the residues 18 are removed with a strong alkaline aqueous solution (hardened residue-removing step). The basic component of the strong alkaline aqueous solution is preferably a hydroxide of alkali metal (e.g., sodium hydroxide, potassium hydroxide). The pH value of the strong alkaline aqueous solution is preferably in the range of 12 to 14, more preferably in the range of 13 to 14. A concrete example of the strong alkaline aqueous solution is 1 to 10 wt. % aqueous solution of sodium or potassium hydroxide.

Even a multi-layered printed circuit board can be also prepared in the above manner. The light-sensitive sheet can be subjected to plating treatment in place of the etching treatment described above. Examples of the plating include copper-plating (e.g., copper sulfate plating, copper pyrophosphate plating), solder plating (e.g., high throw solder plating), Watts bath (nickel sulfate-nickel chloride) plating, nickel plating (e.g., nickel sulfamate plating), and gold plating (e.g., soft gold plating, hard gold plating).

EXAMPLE 1

A polyethylene terephthalate film (thickness: 20 μm) was coated with a coating solution comprising the following components. The coating solution was dried to form a first light-sensitive layer (thickness: 25 µm).

| Coating solution for first light-sensitive layer | |
|---|---|
| Methyl methacrylate/2-ethylhexyl acrylate/benzyl methacrylate/methacylic acid copolymer (molar ratio = 55/11.7/4.5/28.8; weight average molecular weight: 90,000; Glass transition temperature (Tg): 70° C.) | 15 weight parts |
| Dodecapropylene glycol diacrylate | 6.5 weight parts |
| Tetraethylene glycol dimethacrylate | 1.5 weight parts |
| 4,4'-Bis(diethylamino)benzophenone | 0.04 weight part |
| Benzophenone | 1.0 weight part |
| 4-Toluenesulfonamide | 0.5 weight part |
| Malachite Green (oxalate salt) | 0.02 weight part |
| 1,2,4-Triazole | 0.01 weight part |
| Leuco Crystal Violet | 0.2 weight part |
| Tribromomethyl phenyl sulfone | 0.1 weight part |
| Methyl ethyl ketone | 30 weight parts |

The first light-sensitive layer was then coated with a coating solution comprising the following components, and then dried to form a second light-sensitive layer (thickness: 5 µm).

| Coating solution for second light-sensitive layer | |
|---|---|
| Copolymer of methyl methacrylate/2-ethylhexyl acrylate/benzyl methacrylate/methacylic acid (molar ratio: 55/11.7/4.5/28.8; weight average molecular weight: 90,000; glass transition temperature (Tg): 50° C.) | 15 weight parts |
| Dodecapropylene glycol diacrylate | 6.5 weight parts |
| Tetraethylene glycol dimethacrylate | 1.5 weight parts |
| 4,4'-Bis(diethylamino)benzophenone | 0.4 weight part |
| Benzophenone | 3.0 weight parts |
| 4-Toluenesulfonamide | 0.5 weight part |
| Malachite Green (oxalate salt) | 0.02 weight part |
| 1,2,4-Triazole | 0.01 weight part |
| Leuco Crystal Violet | 0.2 weight part |
| Tribromomethyl phenyl sulfone | 0.1 weight part |
| Methyl ethyl ketone | 10 weight parts |
| 1-Methoxy-2-propanol | 20 weight parts |

A polyethylene film (thickness: 20 µm) was laminated on the second light-sensitive layer to prepare a light-sensitive sheet.

The deviation of thickness of each layer is within the range of ±5%. The sensitivity of the light-sensitive sheet was measured in the manner described after. The results are as follows:

Shortest development time: 25 seconds;

Light energy (A) required for completing hardening reaction of the second light-sensitive layer:
4 mJ/cm$^2$;

Light energy (B) required for completing hardening reaction of the first light-sensitive layer:
40 mJ/cm$^2$;

Light energy (C) required for initiating hardening reaction of the first light-sensitive layer:
14 mJ/cm$^2$;

Ratio of energies C/A: 3.5;

Ratio of energies A/B: 0.1; and

Ratio of the sensitivity of the second light-sensitive layer to the sensitivity of the first light-sensitive layer: 10.

EXAMPLE 2

The procedure of Example 1 was repeated except that 0.4 weight part of 4,4'-bis(diethylamino)benzophenone and 3.0 weight parts of benzophenone in the coating solution for second light-sensitive layer were replaced with 0.16 weight part of N-methylacridone and 1.04 weight parts of 2,2'-bis (2-chlorophenyl)-4,4',5,5,'-tetraphenylbiimidazole, respectively, to prepare a light-sensitive sheet.

The deviation of thickness of each layer is within the range of ±5%. The sensitivity of the prepared light-sensitive sheet was measured in the manner described after. The results are as follows:

Shortest development time: 25 seconds;

Light energy (A) required for completing hardening reaction of the second light-sensitive layer:
2 mJ/cm$^2$;

Light energy (B) required for completing hardening reaction of the first light-sensitive layer:
40 mJ/cm$^2$;

Light energy (C) required for initiating hardening reaction of the first light-sensitive layer:
14 mJ/cm$^2$;

Ratio of energies C/A: 7;

Ratio of energies A/B: 0.05; and

Ratio of the sensitivity of the second light-sensitive layer to the sensitivity of the first light-sensitive layer: 20.

EXAMPLE 3

The procedure of Example 1 was repeated except that the amount of the methyl methacrylate/2-ethylhexyl acrylate/benzyl methacrylate/methacylic acid copolymer in the coating solution for second light-sensitive layer was changed from 15 weight parts to 13 weight parts, the amount of dodecapolypropylene glycol diacrylate in the coating solution for second light-sensitive layer was changed from 6.5 weight parts to 8.1 weight parts, and the amount of tetraethylene glycol dimethacrylate in the coating solution for second light-sensitive layer was changed from 1.5 weight parts to 1.9 weight parts to prepare a light-sensitive sheet.

The deviation of thickness of each layer is within the range of ±5%. The sensitivity of the prepared light-sensitive sheet was measured in the manner described after. The results are as follows:

Shortest development time: 25 seconds,

Light energy (A) required for completing hardening reaction of the second light-sensitive layer:
2 mJ/cm$^2$, Light energy (B) required for completing hardening reaction of the first light-sensitive layer:
40 mJ/cm$^2$, Light energy (C) required for initiating hardening reaction of the first light-sensitive layer:
14 mJ/cm$^2{}_1$, Ratio of energies C/A: 7, Ratio of energies A/B: 0.05, and Ratio of the sensitivity of the second light-sensitive layer to the sensitivity of the first light-sensitive layer: 20

EXAMPLE 4

The procedure of Example 3 was repeated except that 0.4 weight part of 4,4'-bis(diethylamino)benzophenone and 3.0 weight parts of benzophenone in the coating solution for second light-sensitive layer were replaced with 0.16 weight part of N-methylacridone and 1.04 weight parts of 2,2'-bis (2-chlorophenyl)-4,4',5,5'-tetraphenylbisimidazole, respectively, and that the first light-sensitive layer was formed from a coating solution comprising the following components, to prepare a light-sensitive sheet.

The deviation of thickness of each layer is within ±5%. The sensitivity of the prepared light-sensitive sheet was measured in the manner described after. The results are as follows:

Shortest development time: 25 seconds;

Light energy (A) required for completing hardening reaction of the second light-sensitive layer:
1 mJ/cm$^2$;

Light energy (B) required for completing hardening reaction of the first light-sensitive layer:
10 mJ/cm$^2$;

Light energy (C) required for initiating hardening reaction of the first light-sensitive layer:
3 mJ/cm$^2$;

Ratio of energies C/A: 3;

Ratio of energies A/B: 0.1; and

Ratio of the sensitivity of the second light-sensitive layer to the sensitivity of the first light-sensitive layer: 10.

| Coating solution for first light-sensitive layer | |
|---|---|
| Copolymer of methyl methacrylate/2-ethylhexyl acrylate/benzyl methacrylate/methacylic acid (molar ratio: 55/11.7/4.5/28.8, weight average molecular weight: 90,000; glass transition temperature (Tg): 70° C.) | 24 weight parts |
| Addition product of hexamethylene diisocyanate and octaethyleneoxide mono(meth)acrylate (1/2, by molar ratio) | 12 weight parts |
| N-methylacridone | 0.2 weight part |
| 2,2'-Bis(o-chlorophenyl)-4,4',5,5'-tetraphenyl-bisimidazole | 0.8 weight part |
| 2-Mercaptobenzimidazole | 0.2 weight part |
| 4-Toluenesulfonamide | 0.8 weight part |
| Malachite Green (oxalate salt) | 0.03 weight part |
| 1,2,4-Triazole | 0.03 weight part |
| Leuco Crystal Violet | 0.32 weight part |
| Tribromomethyl phenyl sulfone | 0.25 weight part |
| Methyl ethyl ketone | 55 weight parts |
| 1-Methoxy-2-propanol | 8 weight parts |

COMPARISON EXAMPLE 1

The procedure of Example 1 was repeated except that the thickness of the first light-sensitive layer was change to 30 μm and that the second light-sensitive layer was not provided, to prepare a light-sensitive sheet.

The sensitivity of the prepared light-sensitive sheet was measured in the manner described after. The results are as follows:

Shortest development time: 25 seconds;

Light energy (B) required for completing hardening reaction of the light-sensitive layer:
40 mJ/cm$^2$; and Light energy (C) required for initiating hardening reaction of the light-sensitive layer:
14 mJ/cm$^2$.

COMPARISON EXAMPLE 2

The procedure of Example 1 was repeated except that the first light-sensitive layer was not provided, to prepare a light-sensitive sheet comprising only the second light-sensitive layer of 5 μm thickness.

The sensitivity of the prepared light-sensitive sheet was measured in the manner described after. The results are as follows:

Shortest development time: 10 seconds or less;

and

Light energy (B) required for completing hardening reaction of the second light-sensitive layer:
4 mJ/cm$^2$.

[Measurement of Sensitivity]

(1) Shortest Development Time

A surface of a copper clad laminate (having no through-hole) was polished, washed with water, and dried to prepare a substrate. Onto the thus-treated surface, the light-sensitive sheet was laminated so that the second light-sensitive layer of the light-sensitive sheet might be in contact with the substrate, and pressed by means of a laminator (MODEL 8B-720-PH, Taisei Laminator Co., ltd.) while the protective film of the light-sensitive sheet being peeled off. The prepared light-sensitive laminate comprised the copper clad laminate, the second light-sensitive layer, the first light-sensitive layer and the polyethylene terephthalate film, layered in this order. The pressing for lamination was carried out under the conditions that the temperature of the pressing roller was 105° C., the pressure given by the roller was 3 kg/cm$^2$, and the speed at which the light-sensitive laminate passed under the roller was 1 m/minute. After the polyethylene terephthalate film was peeled from the light-sensitive laminate, 1 wt. % sodium carbonate aqueous solution at 30° C. was sprayed at the pressure of 0.15 Mpa onto the whole light-sensitive layers on the copper clad laminate. The time from beginning to spray the sodium carbonate solution until dissolving and removing the light-sensitive layers was measured, and was defined as the shortest development time.

(2) Sensitivity

The light-sensitive sheet was fixed on the substrate in the same manner as described above (1). Onto the light-sensitive layers of the light-sensitive sheet, a laser beam of 405 nm was applied through the polyethylene terephthalate film while the light energy was step-by-step increased from 0.1 mJ/cm$^2$ to 100 mJ/cm$^2$ by such an increasing step that an increased energy might be 2.5 times as large as the previous energy. The thus-hardened layers were left at room temperature for 10 minutes, and then the polyethylene terephthalate film was peeled from the light-sensitive laminate. Onto the whole layers on the copper clad laminate, 1 wt. % sodium carbonate aqueous solution at 30° C. was sprayed at the pressure of 0.15 Mpa for twice the shortest development time measured above (1) so that the unhardened resin might be dissolved and removed. The thickness of the remaining hardened layer(s) was measured and plotted against the applied light energy, to obtain a sensitivity curve. On the basis of the obtained sensitivity curve, the light energy giving the thickness of 5 μm (light energy A), that giving the thickness of 30 μm (light energy B) and that first giving the thickness of more than 5 μm (light energy C) were estimated.

(3) Resolution

The procedure of (1) was repeated to prepare a light-sensitive laminate comprising a copper clad laminate, a second light-sensitive layer, a first light-sensitive layer and a polyethylene terephthalate film, layered in this order. The light-sensitive laminate was left at room temperature (23° C., 55% RH) for 10 minutes, and then exposed to a laser beam of 405 nm through the polyethylene terephthalate film.

The laser beam was moved so that a striped pattern might be formed. The pattern comprised lines and spaces among them at the ratio of 1/1, and the width of each line was step-by-step increased from 10 μm to 50 μm by such an increasing step that a line might be wider than the next line by 5 μm. The laser beam had energy needed to harden the second light-sensitive layer. The exposed light-sensitive laminate was left at room temperature for 10 minutes, and then the polyethylene terephthalate film was peeled from the light-sensitive laminate. Onto the whole layers on the copper clad laminate, 1 wt. % sodium carbonate aqueous solution at 30° C. was sprayed at the pressure of 0.15 Mpa for twice the shortest development time measured above (1) so that the unhardened resin might be dissolved and removed. The pattern made of the hardened resin on the copper clad laminate was observed through an optical microscope, to measure width of the narrowest line having no defect or fault. The thus-measured width was defined as the resolution. The smaller the resolution is, the better the light-sensitive sheet is.

(4) Printed Circuit Board

A copper clad laminate provided with a through-hole of 3 mm diameter in which a copper-plating layer was formed on the inner wall was used. The surface of the copper clad laminate was polished, washed with water, and dried. The protective film was peeled from the light-sensitive sheet, and then the light-sensitive sheet was laminated on the thus-treated surface in the above manner so that the second light-sensitive layer of the light-sensitive sheet might be in contact with the copper clad laminate. Thus, a light-sensitive laminate comprising the copper clad laminate, the second light-sensitive layer, the first light-sensitive layer and the polyethylene terephthalate film, layered in this order was produced. The light-sensitive laminate was left at room temperature (23° C., 55% RH) for 10 minutes, and then exposed to a laser beam of 405 nm through the polyethylene terephthalate film. The laser beam having energy needed to harden only the second light-sensitive layer was applied according to a predetermined pattern, to form a hardened layer corresponding to wiring of the circuit pattern. On the other hand, the area where a mouth of the through-hole and neighborhood thereof is located is exposed to the laser beam having enough energy to harden both first and second light-sensitive layers. After the polyethylene terephthalate film was peeled from the exposed light-sensitive laminate, 1 wt. % sodium carbonate aqueous solution at 30° C. was sprayed in the above manner so that the unhardened resin was dissolved and removed, to form a relief of the hardened layer(s). The pattern of the relief was observed through an optical microscope, to confirm whether the hardened layer(s) on the pattern came off or not and whether the tenting film was broken or not.

Independently, the thickness of the hardened layer(s) was measured with a laser microscope (VK-9500, Keyence Corp.). As a result, it was found that the thicknesses at the circuit pattern and at the mouth of through-hole were 5 μm and 30 μm, respectively.

The patterned surface was then sprayed with iron(III) chloride enchant (etching solution containing iron(III) chloride), to dissolve and remove the copper layer not covered with the hardened layer (namely, in the bared area). The surface was further sprayed with 2 wt. % sodium hydroxide aqueous solution, to remove the relief of hardened resin. Thus, a printed circuit board provided with a through-hole was produced. On the thus-produced board, the copper layer in the circuit pattern was clearly formed. The produced printed circuit board was observed with the eyes to confirm whether troubles occurred or not on the copper-plating layer in the through-hole.

The results are set forth in Table 1.

TABLE 1

|  | Resolution (μm) | Coming off of hardened layer | Break of tenting film | Trouble of copper-plating in through-hole |
|---|---|---|---|---|
| Example 1 | 20 | Not | Not | Not |
| Example 2 | 20 | Not | Not | Not |
| Example 3 | 20 | Not | Not | Not |
| Example 4 | 20 | Not | Not | Not |
| Comp. Ex. 1 | 40 | Not | Not | Not |
| Comp. Ex. 2 | 20 | Not | Broken everywhere | Occurred (no copper remained) |

EXAMPLE 5

A polyethylene terephthalate film (thickness: 20 μm) was coated with a coating solution comprising the following components. The coating solution was dried to form a first light-sensitive layer (thickness: 20 μm). The absorption of light at wavelength of 405 nm was 0.3. The transmittance of light was 50%. The absorption of light at wavelength of 365 nm was less than 0.2.

| Coating solution for first light-sensitive layer | |
|---|---|
| Methyl methacrylate/2-ethylhexyl acrylate/benzyl methacrylate/methacylic acid copolymer (molar ratio = 55/11.7/4.5/28.8; weight average molecular weight: 90,000; Glass transition temperature (Tg): 70° C.) | 15 weight parts |
| Dodecapropylene glycol diacrylate | 6.5 weight parts |
| Tetraethylene glycol dimethacrylate | 1.5 weight parts |
| N-methylacridone | 0.08 weight part |
| Benzophenone | 1.0 weight part |
| 4-Toluenesulfonamide | 0.5 weight part |
| Malachite Green (oxalate salt) | 0.02 weight part |
| 3-Morpholinomethyl-1-phenyltriazol-2-thione | 0.01 weight part |
| Leuco Crystal Violet | 0.2 weight part |
| Tribromomethyl phenyl sulfone | 0.1 weight part |
| Methyl ethyl ketone | 30 weight parts |

The first light-sensitive layer was then coated with a coating solution comprising the following components, and then dried to form a second light-sensitive layer (thickness: 5 μm). The absorption of light at wavelength of 405 nm was 0.3. The absorption of light at wavelength of 365 nm was less than 0.2.

| Coating solution for second light-sensitive layer | |
|---|---|
| Copolymer of methyl methacrylate/2-ethylhexyl acrylate/benzyl methacrylate/methacylic acid (molar ratio: 55/11.7/4.5/28.8; weight average molecular weight: 90,000; glass transition temperature (Tg): 50° C.) | 15 weight parts |
| Dodecapropylene glycol diacrylate | 6.5 weight parts |
| Tetraethylene glycol dimethacrylate | 1.5 weight parts |
| N-methylacridone | 0.16 weight part |
| Benzophenone | 3.0 weight parts |
| 4-Toluenesulfonamide | 0.5 weight part |
| Malachite Green (oxalate salt) | 0.02 weight part |

-continued

| Coating solution for second light-sensitive layer | |
| --- | --- |
| 3-Morpholinomethyl-1-phenyltriazol-2-thione | 0.01 weight part |
| Leuco Crystal Violet | 0.2 weight part |
| Tribromomethyl phenyl sulfone | 0.1 weight part |
| Methyl ethyl ketone | 30 weight parts |

A polyethylene film (thickness: 20 µm) was laminated on the second light-sensitive layer to prepare a light-sensitive sheet.

The deviation of thickness of each layer is within the range of ±5%. The sensitivity of the light-sensitive sheet was measured in the same manner as in Example 1. The results are as follows:

Light energy (A) required for completing hardening reaction of the second light-sensitive layer:
$4 \text{ mJ/cm}^2$;

Light energy (B) required for completing hardening reaction of the first light-sensitive layer:
$20 \text{ mJ/cm}^2$;

Light energy (C) required for initiating hardening reaction of the first light-sensitive layer:
$10 \text{ mJ/cm}^2$;

Ratio of energies C/A: 2.5;

Ratio of energies A/B: 0.2; and

Ratio of the sensitivity of the second light-sensitive layer to the sensitivity of the first light-sensitive layer: 5.

The invention claimed is:

1. A light-sensitive sheet comprising a support, a first light-sensitive layer and a second light-sensitive layer in order, wherein each of the first and second light-sensitive layers independently contains a binder, a polymerizable compound and a photo-polymerization initiator, wherein light-sensitivity of the second light-sensitive layer is higher than light-sensitivity of the first light-sensitive layer, and wherein the light-sensitive sheet has a shape of a long film wound up into a roll.

2. The light-sensitive sheet as defined in claim 1, wherein light energy required for completing hardening reaction of the first light-sensitive layer and light energy required for completing hardening reaction of the second light-sensitive layer satisfy the condition of:

$$0.005 > A/B > 0.5$$

in which A is the light energy required for completing hardening reaction of the second light-sensitive layer, and B is the light energy required for completing hardening reaction of the first light-sensitive layer.

3. The light-sensitive sheet as defined in claim 1, wherein light energy required for completing hardening reaction of the second light-sensitive layer and light energy required for initiating hardening reaction of the first light-sensitive layer satisfy the condition of:

$$1 > C/A > 10$$

in which A is the light energy required for completing hardening reaction of the second light-sensitive layer, and C is the light energy required for initiating hardening reaction of the first light-sensitive layer.

4. The light-sensitive sheet as defined in claim 1, wherein each of the first and second light-sensitive layers independently further contains a sensitizer, and an amount of the sensitizer contained in the second light-sensitive layer is larger than an amount of the sensitizer contained in the first light-sensitive layer.

5. The light-sensitive sheet as defined in claim 1, wherein an amount of the photo-polymerization initiator contained in the second light-sensitive layer is larger than an amount of the photo-polymerization initiator contained in the first light-sensitive layer.

6. The light-sensitive sheet as defined in claim 1, wherein an amount of the polymerizable compound contained in the second light-sensitive layer is larger than an amount of the polymerizable compound contained in the first light-sensitive layer.

7. The light-sensitive sheet as defined in claim 1, wherein the first light-sensitive layer has a thickness in the range of 1 to 100 um, the second light-sensitive layer has a thickness in the range of 0.1 to 15 um, and the thickness of the first light-sensitive layer is larger than the thickness of the second light-sensitive layer.

8. The light-sensitive sheet as defined in claim 1, wherein the first light-sensitive layer has absorption of light in the range of 0.1 to 1.0 at wavelength of 405 nm.

9. The light-sensitive sheet as defined in claim 1, wherein the first light-sensitive layer or the second light-sensitive layer contains a compound having the absorption maximum within wavelength region of 380 to 430 nm.

10. The light-sensitive sheet as defined in claim 9, wherein the compound having the absorption maximum within wavelength region of 380 to 430 nm is a sensitizer.

11. The light-sensitive sheet as defined in claim 1, wherein the support comprises a transparent polymer film.

12. The light-sensitive sheet as defined in claim 1, wherein the light-sensitive sheet comprises the support, the first light-sensitive layer, the second light-sensitive layer and a protective film in order, and wherein adhesion force between the support and the first light-sensitive layer and adhesion force between the protective film and the second light-sensitive layer satisfy the condition of:

$$Su > Pr$$

in which Su is the adhesion force between the support and the first light-sensitive layer, and Pr is the adhesion force between the protective film and the second light-sensitive layer.

13. The light-sensitive sheet as defined in claim 1, wherein the light-sensitive sheet is used for preparation of a printed circuit board.

* * * * *